United States Patent
Chen et al.

(10) Patent No.: US 11,538,428 B2
(45) Date of Patent: Dec. 27, 2022

(54) SHIFT REGISTER AND DRIVE METHOD THEREOF, AND GATE DRIVE CIRCUIT

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Shuai Chen, Beijing (CN); Xiuzhu Tang, Beijing (CN); Hailong Wu, Beijing (CN); Jianfeng Yuan, Beijing (CN); Zhi Zhang, Beijing (CN); Xuebo Liang, Beijing (CN); Qian Wang, Beijing (CN); Qiyuan Wei, Beijing (CN); Qi Li, Beijing (CN)

(73) Assignees: CHONGQING BOE OPTOELECTRONICS TECHNOLOGY CO., LTD., Chongqing (CN); Beijing BOE Technology Development Co., Ltd., Beijing (CN)

( * ) Notice: Subject to any disclaimer, the term of this patent is extended or adjusted under 35 U.S.C. 154(b) by 9 days.

(21) Appl. No.: 16/645,721

(22) PCT Filed: Mar. 1, 2019

(86) PCT No.: PCT/CN2019/076671
§ 371 (c)(1),
(2) Date: Mar. 9, 2020

(87) PCT Pub. No.: WO2020/177008
PCT Pub. Date: Sep. 10, 2020

(65) Prior Publication Data
US 2021/0217374 A1 Jul. 15, 2021

(51) Int. Cl.
*G09G 3/36* (2006.01)
*G11C 19/18* (2006.01)
*G11C 19/28* (2006.01)

(52) U.S. Cl.
CPC ......... *G09G 3/3614* (2013.01); *G09G 3/3677* (2013.01); *G11C 19/28* (2013.01);
(Continued)

(58) Field of Classification Search
CPC ....... G11C 19/28; G09G 3/3614–3677; G09G 2300/0408–0842; G09G 2310/0267–061
See application file for complete search history.

(56) References Cited

U.S. PATENT DOCUMENTS

2015/0170568 A1* 6/2015 Lee ...................... G11C 19/287
345/77
2016/0141051 A1* 5/2016 Chen ...................... G11C 19/28
377/75
(Continued)

FOREIGN PATENT DOCUMENTS

CN 105096889 A 11/2015
CN 105609137 A 5/2016
(Continued)

OTHER PUBLICATIONS

PCT International Search Report, Application No. PCT/CN2019/076671, dated Dec. 2, 2019, 8 pages; with English translation.
(Continued)

*Primary Examiner* — Lin Li
(74) *Attorney, Agent, or Firm* — Armstrong Teasdale LLP

(57) ABSTRACT

The present disclosure provides a shift register, a drive method thereof, and a gate drive circuit. The shift register includes an input circuit, a reset circuit, a first output circuit, and a second output circuit. The input circuit is configured to provide an input signal from an input terminal to a first
(Continued)

node. The reset circuit is configured to provide a first voltage from a first voltage terminal to the first node under the control of a reset signal from a reset signal terminal. The first output circuit is configured to output from a first output terminal one of a first clock signal and a second clock signal as a first scan signal. The second output circuit is configured to output from a second output terminal the other of the first clock signal and the second clock signal as a second scan signal.

14 Claims, 9 Drawing Sheets

(52) U.S. Cl.
CPC ............ *G09G 2300/0408* (2013.01); *G09G 2300/0823* (2013.01); *G09G 2300/0842* (2013.01); *G09G 2310/0267* (2013.01); *G09G 2310/0286* (2013.01); *G09G 2310/061* (2013.01)

(56) References Cited

U.S. PATENT DOCUMENTS

| | | | | |
|---|---|---|---|---|
| 2018/0182300 A1* | 6/2018 | Chen | ................... | G09G 3/3674 |
| 2018/0268914 A1* | 9/2018 | Zhao | ................... | G11C 19/184 |
| 2019/0130806 A1* | 5/2019 | Li | ......................... | G09G 3/3674 |
| 2019/0311691 A1* | 10/2019 | Feng | ................... | G09G 3/3677 |

FOREIGN PATENT DOCUMENTS

| | | | | |
|---|---|---|---|---|
| CN | 106157912 A | | 11/2016 | |
| CN | 106710561 A | * | 5/2017 | ............... G09G 3/20 |
| CN | 108172195 A | | 6/2018 | |
| CN | 108288460 A | | 7/2018 | |
| JP | 2008140522 A | | 6/2008 | |

OTHER PUBLICATIONS

PCT Written Opinion, Application No. PCT/CN2019/076671, dated Dec. 2, 2019, 7 pages.: with English translation of relevant part.

* cited by examiner

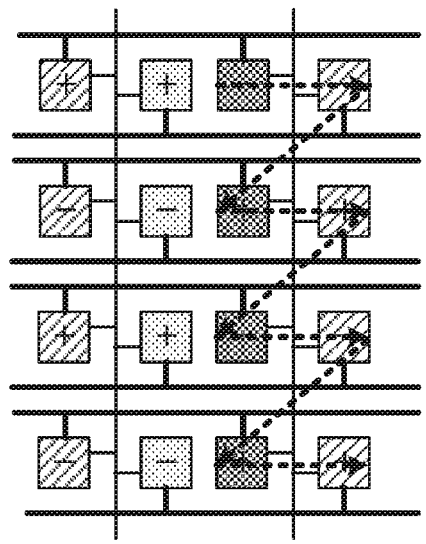
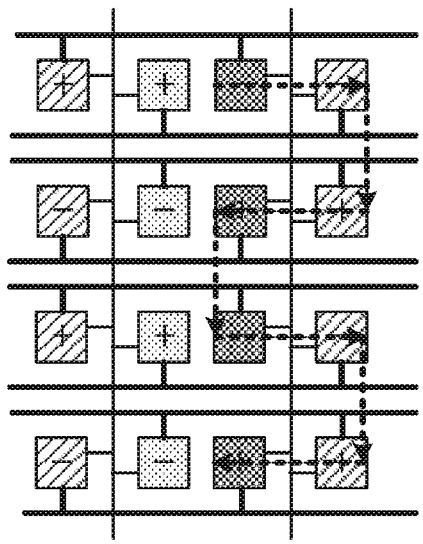
FIG. 1A  FIG. 1B
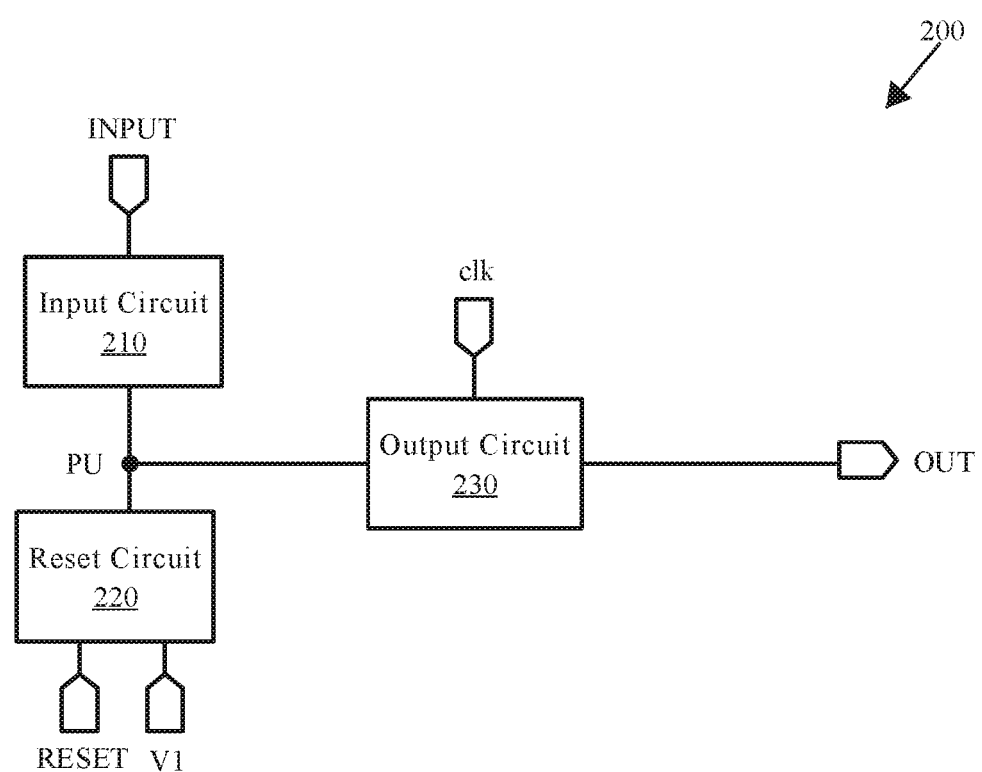
FIG. 2

SHIFT REGISTER AND DRIVE METHOD THEREOF, AND GATE DRIVE CIRCUIT

CROSS REFERENCE TO RELATED APPLICATIONS

This patent application is a National Stage Entry of PCT/CN2019/076671 filed on Mar. 1, 2019, the disclosure of which is incorporated by reference herein in its entirety as part of the present application.

BACKGROUND

Embodiments of the present disclosure relate to the field of display technology, and more particularly, to a shift register and a drive method thereof, a gate drive circuit and a display device.

Gate Driver on Array (GOA) technology makes a gate drive circuit on an array substrate, to realize the function of scanning a pixel circuit row-by-row. The gate drive circuit may include a plurality of cascaded shift registers. A scan signal is outputted from an output terminal of the respective shift register to drive the pixel circuit at the respective row.

BRIEF DESCRIPTION

Embodiments of the present disclosure provide a shift register and a drive method thereof, a gate drive circuit and a display device.

A first aspect of the present disclosure provides a shift register including an input circuit, a reset circuit, a first output circuit, and a second output circuit. The input circuit is coupled to an input terminal and a first node, and is configured to provide an input signal from the input terminal to the first node. The reset circuit is coupled to a reset signal terminal, the first node, and a first voltage terminal, and is configured to provide a first voltage from the first voltage terminal to the first node under the control of a reset signal from the reset signal terminal. The first output circuit is coupled to the first node, a first control signal terminal, a second control signal terminal, a first clock signal terminal, a second clock signal terminal, and a first output terminal, and is configured to output from the first output terminal one of a first clock signal from the first clock signal terminal and a second clock signal from the second clock signal terminal, as a first scan signal, based on a first control signal from the first control signal terminal, a second control signal from the second control signal terminal, and a voltage of the first node. The second output circuit is coupled to the first node, the first control signal terminal, the second control signal terminal, the first clock signal terminal, the second clock signal terminal, and a second output terminal, and is configured to output from the second output terminal the other of the first clock signal and the second clock signal, as a second scan signal, based on the first control signal, the second control signal, and the voltage of the first node.

In some embodiments of the present disclosure, the input circuit includes a first transistor. A control electrode and a first electrode of the first transistor are coupled to the input terminal. A second electrode of the first transistor is coupled to the first node.

In some embodiments of the present disclosure, the reset circuit includes a second transistor. A control electrode of the second transistor is coupled to the reset signal terminal. A first electrode of the second transistor is coupled to the first voltage terminal. A second electrode of the second transistor is coupled to the first node.

In some embodiments of the present disclosure, the first output circuit includes a third transistor, a fourth transistor, a fifth transistor, and a capacitor. A control electrode of the third transistor is coupled to a first terminal of the capacitor and the first node. A first electrode of the third transistor is coupled to a second electrode of the fourth transistor and a second electrode of the fifth transistor. A second electrode of the third transistor is coupled to a second terminal of the capacitor and the first output terminal. A control electrode of the fourth transistor is coupled to the first control signal terminal. A first electrode of the fourth transistor is coupled to the first clock signal terminal. A control electrode of the fifth transistor is coupled to the second control signal terminal. A first electrode of the fifth transistor is coupled to the second clock signal terminal.

In some embodiments of the present disclosure, the second output circuit includes a sixth transistor, a seventh transistor, and an eighth transistor. A control electrode of the sixth transistor is coupled to the first node. A first electrode of the sixth transistor is coupled to a second electrode of the seventh transistor and a second electrode of the eighth transistor. A second electrode of the sixth transistor is coupled to the second output terminal. A control electrode of the seventh transistor is coupled to the first control signal terminal. A first electrode of the seventh transistor is coupled to the second clock signal terminal. A control electrode of the eighth transistor is coupled to the second control signal terminal. A first electrode of the eighth transistor is coupled to the first clock signal terminal.

In some embodiments of the present disclosure, the shift register further includes a first selection circuit and a second selection circuit. The first selection circuit is configured to provide the first scan signal to one of a first selection output terminal and a second selection output terminal based on a third control signal and a fourth control signal. The second selection circuit is configured to provide the second scan signal to one of a third selection output terminal and a fourth selection output terminal based on the third control signal and the fourth control signal.

In some embodiments of the present disclosure, the first selection circuit includes a ninth transistor and a tenth transistor. A control electrode of the ninth transistor is coupled to the fourth control signal terminal. A first electrode of the ninth transistor is coupled to the first output terminal. A second electrode of the ninth transistor is coupled to the first selection output terminal. A control electrode of the tenth transistor is coupled to the third control signal terminal. A first electrode of the tenth transistor is coupled to the first output terminal. A second electrode of the tenth transistor is coupled to the second selection output terminal.

In some embodiments of the present disclosure, the second selection circuit includes an eleventh transistor and a twelfth transistor. A control electrode of the eleventh transistor is coupled to the third control signal terminal. A first electrode of the eleventh transistor is coupled to the second output terminal. A second electrode of the eleventh transistor is coupled to the third selection output terminal. A control electrode of the twelfth transistor is coupled to the fourth control signal terminal. A first electrode of the twelfth transistor is coupled to the second output terminal. A second electrode of the twelfth transistor is coupled to the fourth selection output terminal.

In some embodiments of the present disclosure, the shift register further includes a noise control circuit, a first denoising circuit, and a second denoising circuit. The noise control circuit is configured to control a voltage of a second node based on the voltage of the first node, the first voltage, and a second voltage. The first denoising circuit is configured to remove noise on the first output terminal based on a voltage of the second node and the first voltage. The second denoising circuit is configured to remove noise on the second output terminal based on the voltage of the second node and the first voltage.

In some embodiments of the present disclosure, the noise control circuit includes a thirteenth transistor, a fourteenth transistor, a fifteenth transistor, and a sixteenth transistor. A control electrode and a first electrode of the thirteenth transistor are coupled to a second voltage terminal. A second electrode of the thirteenth transistor is coupled to a second electrode of the fourteenth transistor and a control electrode of the fifteenth transistor. A control electrode of the fourteenth transistor is coupled to the first node. A first electrode of the fourteenth transistor is coupled to the first voltage terminal. A first electrode of the fifteenth transistor is coupled to the second voltage terminal. A second electrode of the fifteenth transistor is coupled to the second node. A control electrode of the sixteenth transistor is coupled to the first node. A first electrode of the sixteenth transistor is coupled to the first voltage terminal. A second electrode of the sixteenth transistor is coupled to the second node.

In some embodiments of the present disclosure, the first denoising circuit includes a seventeenth transistor. A control electrode of the seventeenth transistor is coupled to the second node. A first electrode of the seventeenth transistor is coupled to the first voltage terminal. A second electrode of the seventeenth transistor is coupled to the first output terminal.

In some embodiments of the present disclosure, the second denoising circuit includes an eighteenth transistor. A control electrode of the eighteenth transistor is coupled to the second node. A first electrode of the eighteenth transistor is coupled to the first voltage terminal. A second electrode of the eighteenth transistor is coupled to the second output terminal.

In some embodiments of the present disclosure, the shift register further includes a third denoising circuit. The third denoising circuit is configured to remove noise on the first node based on the voltage of the second node and the first voltage.

In some embodiments of the present disclosure, the third denoising circuit includes a nineteenth transistor. A control electrode of the nineteenth transistor is coupled to the second node. A first electrode of the nineteenth transistor is coupled to the first voltage terminal. A second electrode of the nineteenth transistor is coupled to the first node.

A second aspect of the present disclosure provides a shift register. The shift register includes first to eighth transistors and a capacitor. A control electrode and a first electrode of the first transistor are coupled to an input terminal. A second electrode of the first transistor is coupled to a first node. A control electrode of the second transistor is coupled to a reset signal terminal. A first electrode of the second transistor is coupled to a first voltage terminal. A second electrode of the second transistor is coupled to the first node. A control electrode of the third transistor is coupled to a first terminal of the capacitor and the first node. A first electrode of the third transistor is coupled to a second electrode of the fourth transistor and a second electrode of the fifth transistor. A second electrode of the third transistor is coupled to a second terminal of the capacitor and a first output terminal. A control electrode of the fourth transistor is coupled to a first control signal terminal. A first electrode of the fourth transistor is coupled to a first clock signal terminal. A control electrode of the fifth transistor is coupled to a second control signal terminal. A first electrode of the fifth transistor is coupled to a second clock signal terminal. A control electrode of the sixth transistor is coupled to the first node. A first electrode of the sixth transistor is coupled to a second electrode of the seventh transistor and a second electrode of the eighth transistor. A second electrode of the sixth transistor is coupled to a second output terminal. A control electrode of the seventh transistor is coupled to the first control signal terminal. A first electrode of the seventh transistor is coupled to the second clock signal terminal. A control electrode of the eighth transistor is coupled to the second control signal terminal. A first electrode of the eighth transistor is coupled to the first clock signal terminal.

In some embodiments of the present disclosure, the shift register further includes ninth to twelfth transistors. A control electrode of the ninth transistor is coupled to a fourth control signal terminal. A first electrode of the ninth transistor is coupled to a second electrode of the third transistor. A second electrode of the ninth transistor is coupled to a first selection output terminal. A control electrode of the tenth transistor is coupled to a third control signal terminal. A first electrode of the tenth transistor is coupled to the second electrode of the third transistor. A second electrode of the tenth transistor is coupled to a second selection output terminal. A control electrode of the eleventh transistor is coupled to the third control signal terminal. A first electrode of the eleventh transistor is coupled to the second electrode of the sixth transistor. A second electrode of the eleventh transistor is coupled to a third selection output terminal. A control electrode of the twelfth transistor is coupled to the fourth control signal terminal. A first electrode of the twelfth transistor is coupled to the second electrode of the sixth transistor. A second electrode of the twelfth transistor is coupled to a fourth selection output terminal.

A third aspect of the present disclosure provides a drive method for driving the shift register as described above. In the drive method, an input signal is provided to the first node. One of a first clock signal and a second clock signal is outputted from the first output terminal, as a first scan signal, based on a first control signal, a second control signal, and a voltage of the first node. And the other of the first clock signal and the second clock signal is outputted from the second output terminal, as a second scan signal, based on the first control signal, the second control signal, and the voltage of the first node.

In some embodiments of the present disclosure, the drive method further includes providing the first scan signal to a first selection output terminal based on a third control signal and a fourth control signal, and providing the second scan signal to a fourth selection output terminal based on the third control signal and the fourth control signal.

In some embodiments of the present disclosure, the drive method further includes providing the first scan signal to a second selection output terminal based on the third control signal and the fourth control signal, and providing the second scan signal to a third selection output terminal based on the third control signal and the fourth control signal.

A fourth aspect of the present disclosure provides a gate drive circuit. The gate drive circuit includes a plurality of cascaded shift registers as described in some of the above embodiments. An input terminal of an $n^{th}$-stage shift register is coupled to a first output terminal of a $(n-1)^{th}$-stage shift register. A reset signal terminal of the $n^{th}$-stage shift register is coupled to a first output terminal of a $(n+3)^{th}$-stage shift register. An input terminal of a first-stage shift register is provided with a start signal. Here, n is a natural number greater than 1.

In some embodiments of the present disclosure, a clock signal provided to a second clock signal terminal of the $n^{th}$-stage shift register lags behind a clock signal provided to a first clock signal terminal of the $n^{th}$-stage shift register by 1/8 clock cycle. A clock signal provided to a first clock signal terminal of a $(n+1)^{th}$-stage shift register lags behind the clock signal provided to the first clock signal terminal of the $n^{th}$-stage shift register by 1/4 lock cycle.

A fifth aspect of the present disclosure provides a gate drive circuit. The gate drive circuit includes a plurality of cascaded shift registers as described in some of the above embodiments. An input terminal of a $n^{th}$-stage shift register is coupled to a second selection output terminal of a $(n-1)^{th}$-stage shift register. A reset signal terminal of the $n^{th}$-stage shift register is coupled to a second selection output terminal of a $(n+3)^{th}$-stage shift register. An input terminal of a first-stage shift register is provided with a start signal. Here, n is a natural number greater than 1.

A sixth aspect of the present disclosure provides a gate drive circuit. The gate drive circuit includes a plurality of cascaded shift registers. An output terminal of the shift register at each stage is coupled to a respective selection circuit of a plurality of selection circuits. The selection circuit coupled to an $n^{th}$-stage shift register is configured to provide a scan signal from the $n^{th}$-shift register to one of a pixel circuit at a $(n-1)^{th}$ row, a pixel circuit at an $n^{th}$ row, and a pixel circuit at a $(n+1)^{th}$ row. The selection circuit coupled to a first-stage shift register is configured to provide a scan signal from the first-stage shift register to either the pixel circuit at the first row or the pixel circuit at the second row. Here, n is a natural number greater than 1.

In some embodiments of the present disclosure, the selection circuit coupled to a $2M^{th}$-stage shift register includes a twentieth transistor, a twenty-first transistor, and a twenty-second transistor. A control electrode of the twentieth transistor is coupled to a fifth control terminal. A first electrode of the twentieth transistor is coupled to an output terminal of the $2M^{th}$-stage shift register. A second electrode of the twentieth transistor is coupled to the pixel circuit at a $(2M-1)^{th}$ row. A control electrode of the twenty-first transistor is coupled to a sixth control terminal. A first electrode of the twenty-first transistor is coupled to an output terminal of the $2M^{th}$-stage shift register. A second electrode of the twenty-first transistor is coupled to the pixel circuit at a $2M^{th}$ row. A control electrode of the twenty-second transistor is coupled to a seventh control terminal. A first electrode of the twenty-second transistor is coupled to an output terminal of a $2M^{th}$-stage shift register. A second electrode of the twenty-second transistor is coupled to the pixel circuit at a $(2M+1)^{th}$ row. The selection circuit coupled to the $(2M+1)^{th}$-stage shift register includes a twenty-third transistor, a twenty-fourth transistor, and a twenty-fifth transistor. A control electrode of the twenty-third transistor is coupled to the seventh control terminal. A first electrode of the twenty-third transistor is coupled to an output terminal of the $(2M+1)^{th}$-stage shift register. A second electrode of the twenty-third transistor is coupled to the pixel circuit at the $2M^{th}$ row. A control electrode of the twenty-fourth transistor is coupled to the sixth control terminal. A first electrode of the twenty-fourth transistor is coupled to the output terminal of the $(2M+1)^{th}$-stage shift register. A second electrode of the twenty-fourth transistor is coupled to the pixel circuit at the $(2M+1)^{th}$ row. A control electrode of the twenty-fifth transistor is coupled to the fifth control terminal. A first electrode of the twenty-fifth transistor is coupled to the output terminal of the $(2M+1)^{th}$-stage shift register. A second electrode of the twenty-fifth transistor is coupled to the pixel circuit at a $(2M+2)^{th}$ row. Here, M is a natural number.

A seventh aspect of the present disclosure provides an array substrate including the gate drive circuit as described above.

An eighth aspect of the present disclosure provides a display device including the array substrate as described above.

BRIEF DESCRIPTION OF THE DRAWINGS

To describe technical solutions of the embodiments of the present disclosure more clearly, the accompanying drawings of the embodiments will be briefly introduced in the following. It should be known that the accompanying drawings in the following description merely involve some embodiments of the present disclosure, but do not limit the present disclosure, in which:

FIGS. 1A and 1B are schematic diagrams illustrating the architectures of two kinds of array substrates;

FIG. 2 is a schematic block diagram of a shift register;

In the drawings, the reference numbers having the same last two-digit correspond to the same elements. It should be noted that the elements in the drawings are schematic and not drawn to scale.

DETAILED DESCRIPTION

Figure 3:
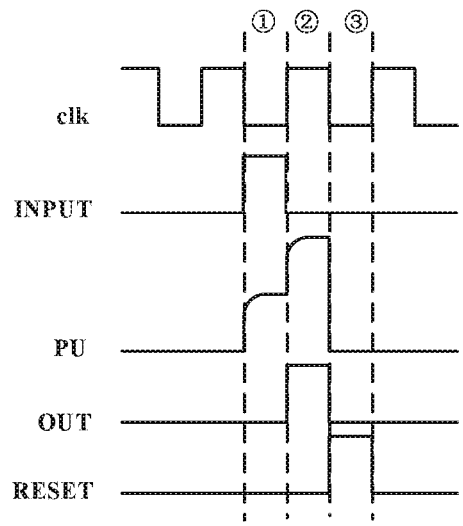
FIG. 3 is a timing diagram of some signals for the shift register as shown in FIG. 2.

To make the technical solutions and advantages of the embodiments of the present disclosure clearer, the technical solutions in the embodiments of the present disclosure will be described clearly and completely below, in conjunction with the accompanying drawings in the embodiments of the present disclosure. Obviously, the described embodiments are merely some but not all of the embodiments of the present disclosure. All other embodiments obtained by those skilled in the art based on the described embodiments of the present disclosure without creative efforts shall fall within the protecting scope of the present disclosure.

Unless otherwise defined, all terms (including technical and scientific terms) used herein have the same meaning as commonly understood by those skilled in the art to which present disclosure belongs. It will be further understood that terms, such as those defined in commonly used dictionaries, should be interpreted as having a meaning that is consistent with their meaning in the context of the specification and will not be interpreted in an idealized or overly formal sense unless expressly so defined herein. As used herein, the description of "connecting" or "coupling" two or more parts together should refer to the parts being directly combined together or being combined via one or more intermediate components.

In all the embodiments of the present disclosure, a source and a drain (an emitter and a collector) of a transistor are symmetrical, and a current from the source to the drain (from the emitter to the collector) to turn on an N-type transistor is in an opposite direction with respect to the current from the source to the drain (from the emitter and the collector) to turn on an a P-type transistor. Therefore, in the embodiments of the present disclosure, a controlled intermediate terminal of the transistor is referred to as a control electrode, and the remaining two terminals are referred to as a first electrode and a second electrode. The transistors used in the embodiments of the present disclosure mainly are switching transistors. In addition, terms such as "first" and "second" are only used to distinguish one element (or a part of the element) from another element (or another part of this element).

With the continuous development of display technology, duel gate line array substrates are widely used in display panels as low-cost array substrates. FIGS. 1A and 1B show the architectures of two kinds of dual gate line array substrates. As shown in FIGS. 1A and 1B, on a duel gate line array substrate, two gate lines are arranged between two adjacent sub-pixel rows, and one data line is shared by every two sub-pixel columns. By sequentially providing scan signals to the gate lines, the respective sub-pixels sharing the same data line are sequentially turned on in the order as shown in FIGS. 1A and 1B. In the array substrate as shown in FIG. 1A, the third sub-pixel at the first row is connected to the gate line at the first row, the fourth sub-pixel at the first row is connected to the gate line at the second row, the third sub-pixel at the second row is connected to the gate line at the third row, and the fourth sub-pixel at the second row is connected to the gate line at the fourth row. Therefore, the respective sub-pixels sharing the same data line are sequentially turned on in the order as a letter "Z". In the array substrate as shown in FIG. 1B, the third sub-pixel at the first row is connected to the gate line at the first row, the fourth sub-pixel at the first row is connected to the gate line at the second row, the third sub-pixel at the second row is connected to the gate line at the fourth row, and the fourth sub-pixel at the second row is connected to the gate line at the third row. Therefore, the respective sub-pixels sharing the same data line is sequentially turned on in the order as a shape of "⊇".

FIG. 2 shows a schematic block diagram of a shift register 200 that can be used to provide scan signals to the array substrates having the above two architectures. As shown in FIG. 2, the shift register 200 includes an input circuit 210, a reset circuit 220, and an output circuit 230. The input circuit 210 is coupled to an input terminal INPUT, a first node PU, the reset circuit 220, and the output circuit 230. The reset circuit 220 is coupled to a reset signal terminal RESET, a first voltage terminal V1, a first node PU, the input circuit 210, and the output circuit 230. The output circuit 230 is coupled to the first node PU, the input circuit 210, the reset circuit 220, a clock signal terminal clk, and the output terminal OUT.

FIG. 3 shows a timing diagram of some signals for the shift register 200 as shown in FIG. 2. In phase ①, the input terminal INPUT is provided with an input signal INPUT. The input signal INPUT is provided to the first node PU via the input circuit 210. In phase ②, the output circuit 230 outputs, from the output terminal OUT, a high voltage level from the clock signal terminal clk as the output signal OUT, under the control of the voltage of the first node PU. In phase ③, the reset signal terminal RESET is provided with a reset signal RESET. The reset circuit 220 provides the first voltage V1 from the first voltage terminal V1 to the first node PU under the control of the reset signal RESET. In this embodiment, the first voltage V1 is at the low voltage level. Since the voltage of the first node PU is reset, the output circuit 230 no longer outputs the voltage from the clock signal terminal clk. In this manner, the shift register 200 may provide a scan signal to a corresponding gate line.

In a liquid crystal display device, the polarities of the voltage differences (i.e., the polarities of the data signals) applied to the liquid crystal molecules usually need to be reversed at regular time intervals, so as to avoid permanent damage to the liquid crystal material due to polarization, and also to avoid the phenomenon of image residual. Usually, a 2Dot-Inversion approach is used to reverse the polarity of the voltage difference on the liquid crystal molecule. In the case of using the 2Dot-Inversion approach, for the "Z"-shaped architecture, the red pixels and the blue pixels may be undercharged. For the "⊇"-shaped architecture, the red pixels, green pixels, and blue pixels may be all undercharged. Therefore, the styles of the pictures displayed by the display devices using these two architectures will be different. Different users may like different styles. In order to meet the needs of different users, producing display devices having two architectures will increase the development costs.

Therefore, the embodiments of the present disclosure propose to switch the lighting order of the sub-pixels by exchanging the waveforms of the scan signals at adjacent rows without changing the hardware architecture of the display device. Specific implementations according to embodiments of the present disclosure are described below.

Figure 4:
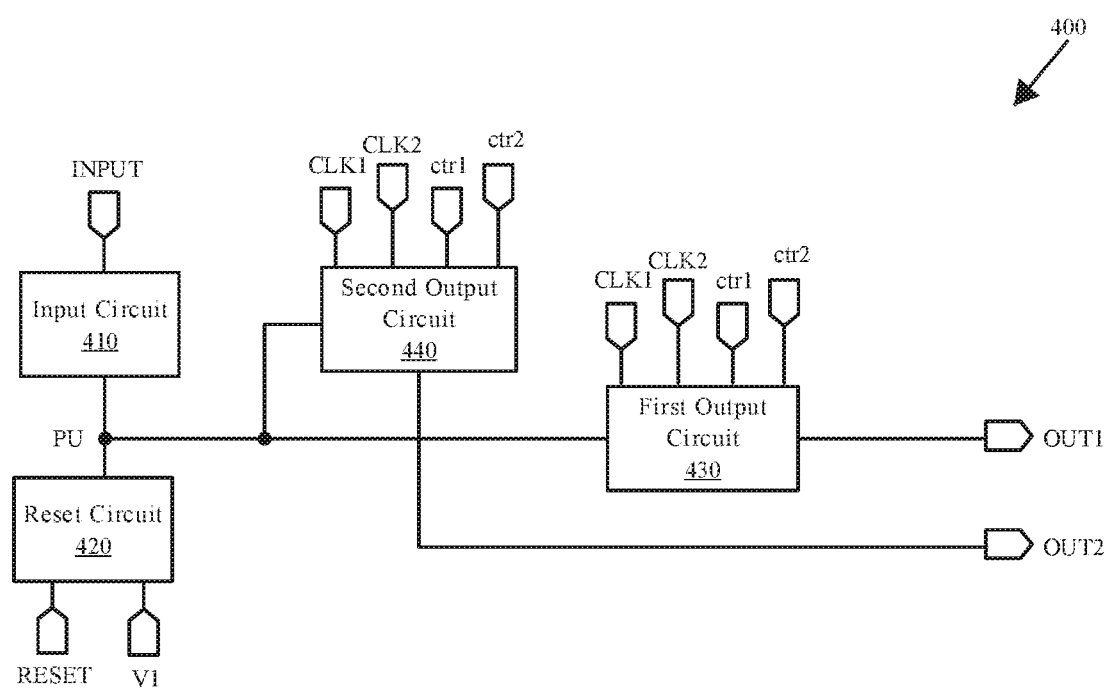
FIG. 4 is a schematic block diagram of a shift register according to an embodiment of the present disclosure.

FIG. 4 illustrates a schematic block diagram of a shift register 400 according to an embodiment of the present disclosure. As shown in FIG. 4, the shift register 400 may include an input circuit 410, a reset circuit 420, a first output circuit 430, and a second output circuit 440.

The input circuit 410 is coupled to the input terminal INPUT and the first node PU, and is configured to provide the input signal INPUT from the input terminal INPUT to the first node PU.

The reset circuit 420 is coupled to the reset signal terminal RESET, the first voltage terminal V1, and the first node PU, and is configured to provide the first voltage V1 from the first voltage terminal V1 to the first node PU under the control of the reset signal RESET from the reset signal terminal RESET, so as to reset the voltage of the first node PU.

The first output circuit 430 is coupled to a first control signal terminal ctr1, a second control signal terminal ctr2, a first clock signal terminal CLK1, a second clock signal terminal CLK2, a first node PU, and a first output terminal OUT1. The first output circuit 430 is configured to output from the first output terminal OUT1 one of a first clock signal clk1 from the first clock signal terminal CLK1 and a second clock signal clk2 from the second clock signal terminal CLK2, as a first scan signal OUT1, based on a first control signal ctr1 from the first control signal terminal ctr1, a second control signal ctr2 from the second control signal terminal ctr2, and a voltage of the first node PU.

The second output circuit 440 is coupled to the first control signal terminal ctr1, the second control signal terminal ctr2, the first clock signal terminal CLK1, the second clock signal terminal CLK2, the first node PU, and the second output terminal OUT2, and is configured to output from the second output terminal OUT2 the other of the first clock signal clk1 and the second clock signal clk2, as a second scan signal OUT2, based on the first control signal ctr1, the second control signal ctr2, and the voltage of the first node PU.

Figure 5:
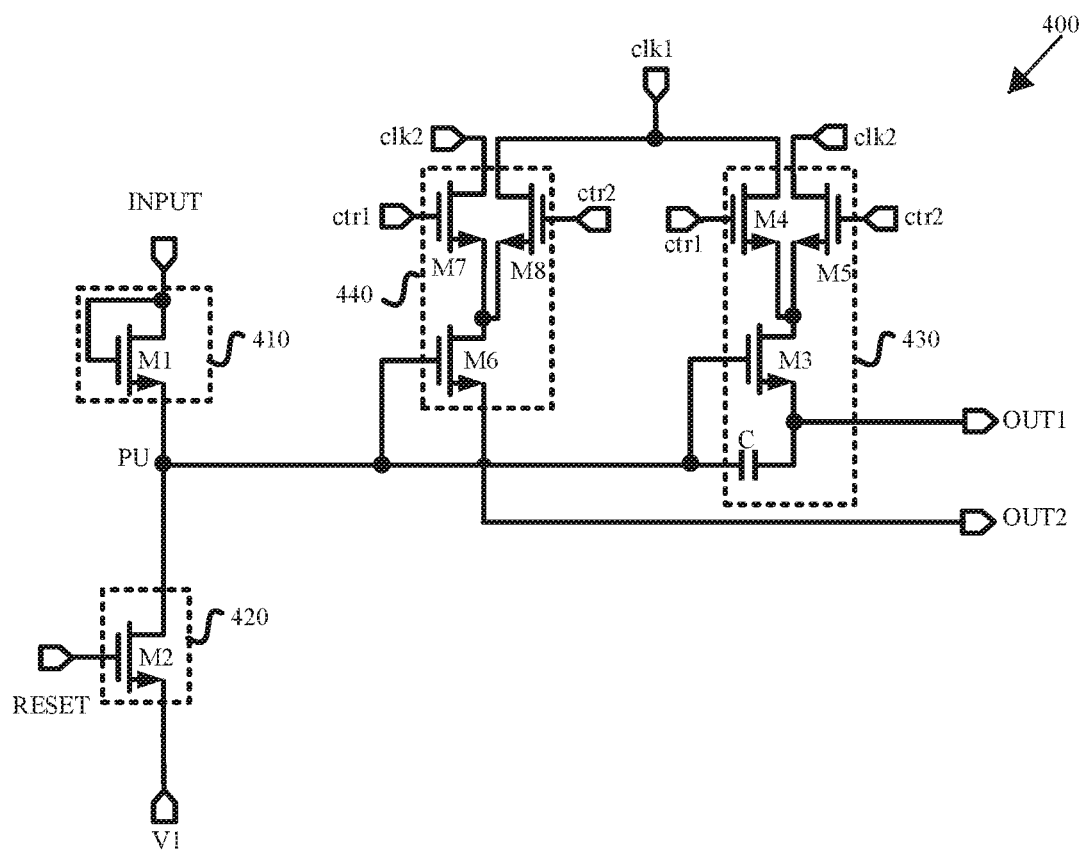
FIG. 5 is an exemplary circuit diagram of the shift register as shown in FIG. 4.

FIG. 5 shows an exemplary circuit diagram of the shift register 400 as shown in FIG. 4. In the embodiments of the present disclosure, N-type transistors are used to implement the shift register 400. Hereinafter, the first voltage V1 is at the low voltage level. Those skilled in the art should understand that in an alternative embodiment of the present disclosure, P-type transistors may also be used to implement the shift register 400.

As shown in FIG. 5, the input circuit 410 may include a first transistor M1. A control electrode and a first electrode of the first transistor M1 are coupled to the input terminal INPUT. A second electrode of the first transistor M1 is coupled to the first node PU.

The reset circuit 420 may include a second transistor M2. A control electrode of the second transistor M2 is coupled to the reset signal terminal RESET. A first electrode of the second transistor M2 is coupled to the first voltage terminal V1. A second electrode of the second transistor M2 is coupled to the first node PU.

The first output circuit 430 may include a third transistor M3, a fourth transistor M4, a fifth transistor M5, and a capacitor C. A control electrode of the third transistor M3 is coupled to a first terminal of the capacitor C and the first node PU. A first electrode of the third transistor M3 is coupled to a second electrode of the fourth transistor M4 and a second electrode of the fifth transistor M5. A second electrode of the third transistor M3 is coupled to a second terminal of the capacitor C and the first output terminal OUT1. A control electrode of the fourth transistor M4 is coupled to the first control signal terminal ctr1. A first electrode of the fourth transistor M4 is coupled to the first clock signal terminal CLK1. A control electrode of the fifth transistor M5 is coupled to the second control signal terminal ctr2. A first electrode of the fifth transistor M5 is coupled to the second clock signal terminal CLK2.

The second output circuit 440 may include a sixth transistor M6, a seventh transistor M7, and an eighth transistor M8. A control electrode of the sixth transistor M6 is coupled to the first node PU. A first electrode of the sixth transistor M6 is coupled to a second electrode of the seventh transistor M7 and a second electrode of the eighth transistor M8. A second electrode of the sixth transistor M6 is coupled to the second output terminal OUT2. A control electrode of the seventh transistor M7 is coupled to the first control signal terminal ctr1. A first electrode of the seventh transistor M7 is coupled to the second clock signal terminal CLK2. A control electrode of the eighth transistor M8 is coupled to the second control signal terminal ctr2. A first electrode of the eighth transistor M8 is coupled to the first clock signal terminal CLK1.

Figure 6:
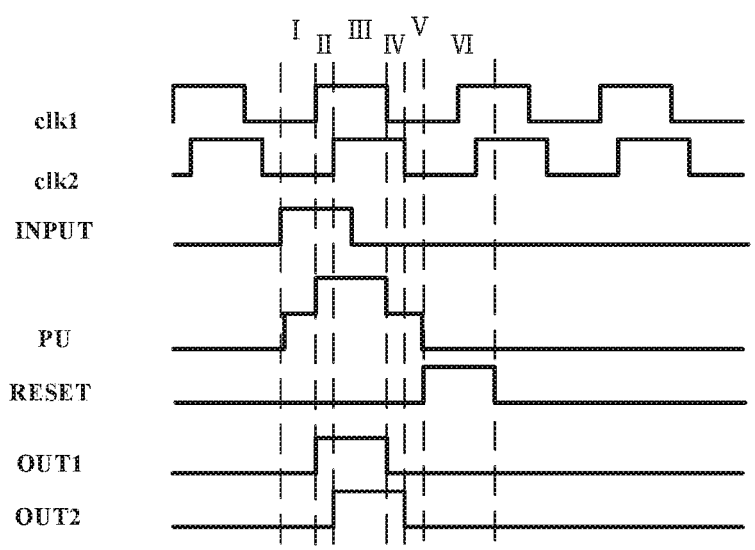
FIG. 6 is a timing diagram of some signals for the shift register as shown in FIG. 5.

FIG. 6 exemplarily shows an example of the timing diagram of some signals for the shift register 400 as shown in FIG. 5. In this example, the input terminal INPUT is provided with the input signal INPUT, and the reset signal terminal RESET is provided with the reset signal RESET. The second clock signal clk2 may lag behind the first clock signal clk1 by 1/q clock cycle. q is a number greater than 1. In the example as shown in FIG. 6, the second clock signal clk2 lags behind the first clock signal clk1 by 1/8 clock cycle. In addition, in this example, it is assumed that the first control signal ctr1 is at the high voltage level and the second control signal ctr2 is at the low voltage level. Since the first control signal ctr1 is at the high voltage level, the fourth transistor M4 and the seventh transistor M7 are enabled. Since the second control signal ctr2 is at the low voltage level, the fifth transistor M5 and the eighth transistor M8 are disabled. Therefore, the first electrode of the third transistor M3 is provided with the first clock signal clk1, and the first electrode of the sixth transistor M6 is provided with the second clock signal clk2.

In the phase I, the input terminal INPUT is provided with the high voltage level. Therefore, the first transistor M1 is enabled, such that the voltage of the first node PU is at the high voltage level. Since the first node PU is at the high voltage level, the third transistor M3 and the sixth transistor M6 are enabled. At this stage, the first clock signal clk1 and the second clock signal clk2 are both at the low voltage level, and therefore, the low voltage levels are outputted from both the first output terminal OUT1 and the second output terminal OUT2.

In the phase II, the input terminal INPUT is provided with the high voltage level continuously. Therefore, the first transistor M1 continues to be enabled, such that the voltage of the first node PU continues to be at the high voltage level. Since the first node PU is at the high voltage level, the third transistor M3 and the sixth transistor M6 continue to be enabled. At this phase, the first clock signal clk1 is at the high voltage level, and the second clock signal clk2 is at the low voltage level. Therefore, the high voltage level is outputted from the first output terminal OUT1, and the low voltage level is outputted from the second output terminal OUT2. Since the voltage level of the second terminal of the capacitor C changes from the low voltage level to the high voltage level, the voltage level of the first terminal of the capacitor C is pulled up again.

In the phase III, the voltage of the first node PU continues to be at the high voltage level under the maintaining function of the capacitor C, so the third transistor M3 and the sixth transistor M6 continue to be enabled. At this phase, the first clock signal clk1 and the second clock signal clk2 are both at the high voltage level. Therefore, the high voltage levels are outputted from both the first output terminal OUT1 and the second output terminal OUT2.

In the phase IV, the voltage of the first node PU continues to be at the high voltage level under the maintaining function of the capacitor C, so the third transistor M3 and the sixth transistor M6 continue to be enabled. At this phase, the first clock signal clk1 becomes at the low voltage level, and the second clock signal clk2 is still at the high voltage level. Therefore, the low voltage level is outputted from the first output terminal OUT1, and the high voltage level is outputted from the second output terminal OUT2. Since the voltage level of the second terminal of the capacitor C changes from the high voltage level to the low voltage level, the voltage level of the first terminal of the capacitor C is pulled down as the voltage at the phase I.

In the phase V, the voltage level of the first node PU continues to be at the high voltage level under the maintaining function of the capacitor C, so the third transistor M3 and the sixth transistor M6 continue to be enabled. At this phase, the first clock signal clk1 continues to be at the low voltage level, and the second clock signal clk2 becomes at the low voltage level. Therefore, the low voltage levels are outputted from both the first output terminal OUT1 and the second output terminal OUT2.

In the phase VI, the reset signal terminal RESET is provided with a reset signal RESET, so the second transistor M2 is enabled. The low voltage level from the first voltage terminal V1 is provided to the first node PU. Since the first node PU is at the low voltage level, the third transistor M3 and the sixth transistor M6 are disabled. The low voltage levels are outputted from both the first output terminal OUT1 and the second output terminal OUT2 as in the previous phase.

Therefore, in this example, the first output circuit 430 outputs, from the first output terminal OUT1, the first clock signal clk1 as the first scan signal OUT1 based on the first control signal ctr1, the second control signal ctr2, and the voltage of the first node PU. The second output circuit 440 outputs, from the second output terminal OUT2, the second clock signal clk2 as the second scan signal OUT2 based on the first control signal ctr1, the second control signal ctr2, and the voltage of the first node PU. As shown in FIG. 6, the second scan signal OUT2 lags behind the first scan signal OUT1 by 1/8 clock cycle.

Figure 7:
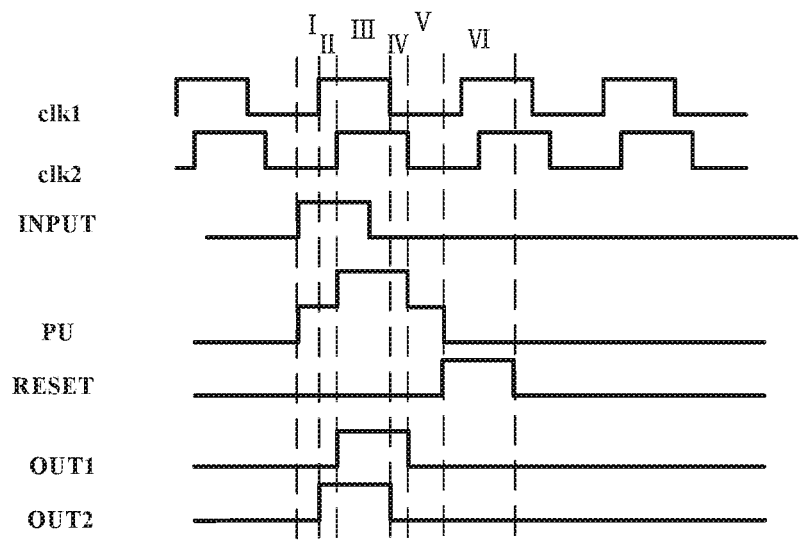
FIG. 7 is a timing diagram of some signals for the shift register as shown in FIG. 5.

FIG. 7 exemplarily shows another example of the timing diagram of some signals for the shift register 400 as shown in FIG. 5. Similar to FIG. 6, the input terminal INPUT is provided with the input signal INPUT, and the reset signal terminal RESET is provided with the reset signal RESET. The second clock signal clk2 lags behind the first clock signal clk1 by 1/8 clock cycle.

In this example, it is assumed that the first control signal ctr1 is at the low voltage level, and the second control signal ctr2 is at the high voltage level. Since the first control signal ctr1 is at the low voltage level, the fourth transistor M4 and the seventh transistor M7 are disabled. Since the second control signal ctr2 is at the high voltage level, the fifth transistor M5 and the eighth transistor M8 are enabled. Therefore, the first electrode of the third transistor M3 is provided with the second clock signal clk2, and the first electrode of the sixth transistor M6 is provided with the first clock signal clk1.

In this example, in the phase I, the input terminal INPUT is provided with the high voltage level. Therefore, the first transistor M1 is enabled, such that the voltage of the first node PU is at the high voltage level. Since the first node PU is at the high voltage level, the third transistor M3 and the sixth transistor M6 are enabled. At this stage, the first clock signal clk1 and the second clock signal clk2 are both at the low voltage level, and therefore, the low voltage levels are outputted from both the first output terminal OUT1 and the second output terminal OUT2.

In the phase II, the input terminal INPUT is provided with the high voltage level continuously. Therefore, the first transistor M1 continues to be enabled, such that the voltage of the first node PU continues to be at the high voltage level. Since the first node PU is at the high voltage level, the third transistor M3 and the sixth transistor M6 continue to be enabled. At this phase, the first clock signal clk1 is at the high voltage level, and the second clock signal clk2 is at the low voltage level. Therefore, the low voltage level of the second clock signal clk2 is outputted from the first output terminal OUT1, and the high voltage level of the first clock signal clk1 is outputted from the second output terminal OUT2. Since the voltage level of the second terminal of the capacitor C changes from the low voltage level to the high voltage level, the voltage level of the first terminal of the capacitor C is pulled up again.

In the phase III, the voltage of the first node PU continues to be at the high voltage level under the maintaining function of the capacitor C, so the third transistor M3 and the sixth transistor M6 continue to be enabled. At this phase, the first clock signal clk1 and the second clock signal clk2 are both at the high voltage level. Therefore, the high voltage level of the second clock signal clk2 is outputted from the first output terminal OUT1, and the high voltage level of the first clock signal clk2 is outputted from the second output terminal OUT2.

In the phase IV, the voltage of the first node PU continues to be at the high voltage level under the maintaining function of the capacitor C, so the third transistor M3 and the sixth transistor M6 continue to be enabled. At this phase, the first clock signal clk1 becomes at the low voltage level, and the second clock signal clk2 is still at the high voltage level. Therefore, the high voltage level of the second clock signal clk2 is outputted from the first output terminal OUT1, and the low voltage level of the first clock signal clk1 is outputted from the second output terminal OUT2.

In the phase V, the voltage level of the first node PU continues to be at the high voltage level under the maintaining function of the capacitor C, so the third transistor M3 and the sixth transistor M6 continue to be enabled. At this phase, the first clock signal clk1 continues to be at the low voltage level, and the second clock signal clk2 becomes at the low voltage level. Therefore, the low voltage levels are outputted from both the first output terminal OUT1 and the second output terminal OUT2. Since the voltage level of the second terminal of the capacitor C changes from the high voltage level to the low voltage level, the voltage level of the first terminal of the capacitor C is pulled down as the voltage at the phase I.

In the phase VI, the reset signal terminal RESET is provided with a reset signal RESET, so the second transistor M2 is enabled. The low voltage level from the first voltage terminal V1 is provided to the first node PU. Since the first node PU is at the low voltage level, the third transistor M3 and the sixth transistor M6 are disabled. The low voltage levels are outputted from both the first output terminal OUT1 and the second output terminal OUT2 as in the previous phase.

Therefore, in this example, the first output circuit 430 may output, from the first output terminal OUT1, the second clock signal clk2 as the first scan signal OUT1 based on the first control signal ctr1, the second control signal ctr2, and the voltage of the first node PU. The second output circuit 440 may output, from the second output terminal OUT2, the first clock signal clk1 as the second scan signal OUT2 based on the first control signal ctr1, the second control signal ctr2, and the voltage of the first node PU. As shown in FIG. 7, the first scan signal OUT1 lags behind the second scan signal OUT2 by 1/8 clock cycle.

Compared with the example as shown in FIG. 6, in FIG. 7, the waveform of the first scan signal OUT1 and the waveform of the second scan signal OUT2 are exchanged.

According to the above embodiment, the shift register 400 may exchange the waveform outputted from the first output terminal OUT1 and the waveform outputted from the second output terminal OUT2 based on the first control signal ctr1 and the second control signal ctr2. Therefore, the shift register 400 can change the order to light on the sub-pixels without changing the architecture of the array substrate, thereby meeting the needs of different users.

Figure 8:
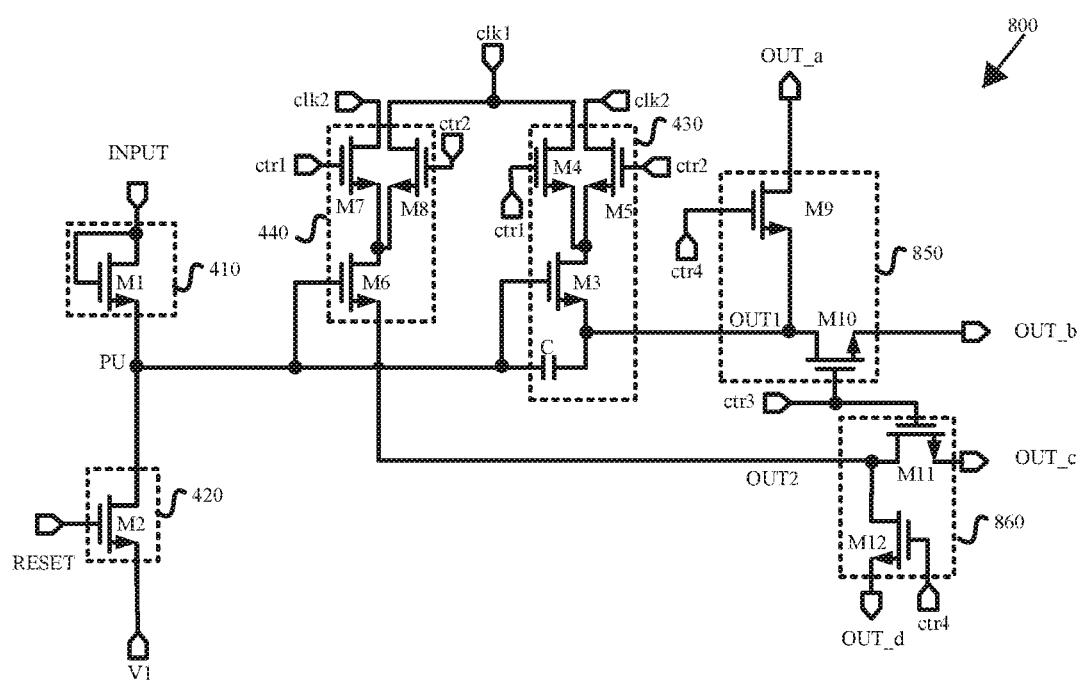
FIG. 8 is an exemplary circuit diagram of the shift register according to an embodiment of the present disclosure.

FIG. 8 illustrates an exemplary circuit diagram of a shift register 800 according to a further embodiment of the present disclosure. As shown in FIG. 8, on a basis of the shift register 400, the shift register 800 further includes a first selection circuit 850 and a second selection circuit 860. The first selection circuit 850 is configured to provide the first scan signal OUT1 to one of a first selection output terminal OUT_a and a second selection output terminal OUT_b based on a third control signal ctr3 and a fourth control signal ctr4. The second selection circuit 860 is configured to provide the second scan signal OUT2 to one of a third selection output terminal OUT_c and a fourth selection output terminal OUT_d based on the third control signal ctr3 and the fourth control signal ctr4.

As shown in FIG. 8, the first selection circuit 850 may include a ninth transistor M9 and a tenth transistor M10. A control electrode of the ninth transistor M9 is coupled to a fourth control signal terminal ctr4. A first electrode of the ninth transistor M9 is coupled to the first output terminal OUT1. A second electrode of the ninth transistor M9 is coupled to the first selection output terminal OUT_a. A control electrode of the tenth transistor M10 is coupled to a third control signal terminal ctr3. A first electrode of the tenth transistor M10 is coupled to the first output terminal OUT1. A second electrode of the tenth transistor M10 is coupled to the second selection output terminal OUT_b. The second selection circuit 860 may include an eleventh transistor M11 and a twelfth transistor M12. A control electrode of the eleventh transistor M11 is coupled to the third control signal terminal ctr3. A first electrode of the eleventh transistor M11 is coupled to the second output terminal OUT2. A second electrode of the eleventh transistor M11 is coupled to the third selection output terminal OUT_c. A control electrode of the twelfth transistor M12 is coupled to the fourth control signal terminal ctr4. A first electrode of the twelfth transistor M12 is coupled to the second output terminal OUT2. A second electrode of the twelfth transistor M12 is coupled to the fourth selection output terminal OUT_d.

Figure 9:
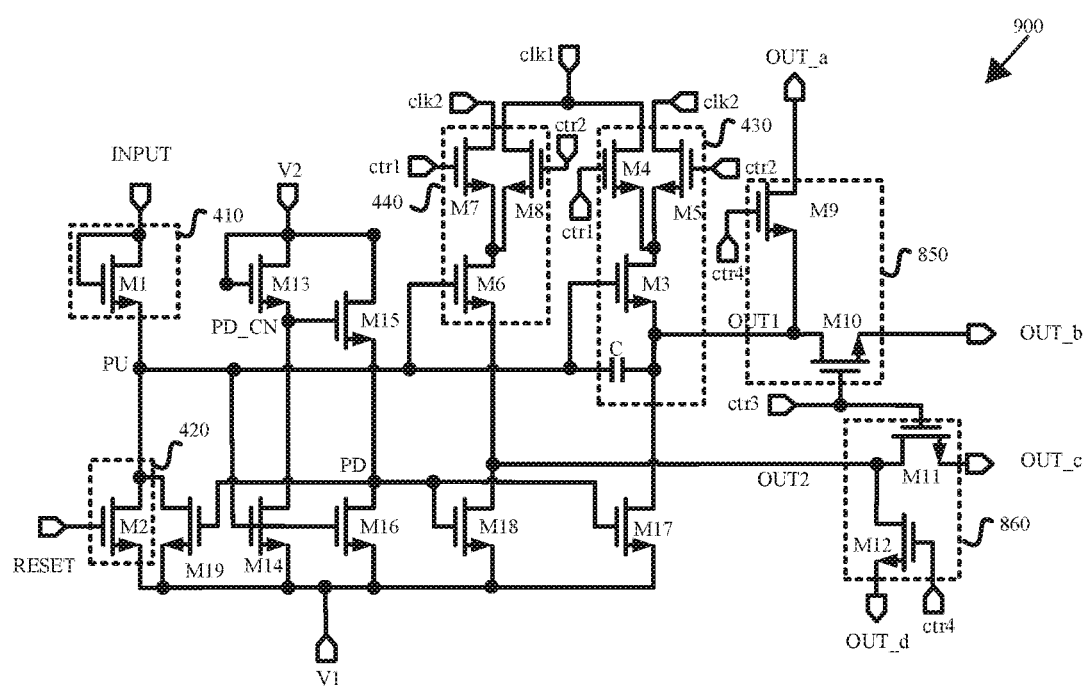
FIG. 9 is an exemplary circuit diagram of the shift register according to an embodiment of the present disclosure.

FIG. 9 illustrates an exemplary circuit diagram of a shift register 900 according to a further embodiment of the present disclosure. As shown in FIG. 9, on a basis of the shift register 800, the shift register 900 may further include a noise control circuit, a first denoising circuit, and a second denoising circuit. The noise control circuit is configured to control the voltage of the second node PD based on the voltage of the first node PU, the first voltage V1, and the second voltage V2. The first denoising circuit is configured to remove noise on the first output terminal OUT1 based on the voltage of the second node PD and the first voltage V1. The second denoising circuit is configured to remove noise on the second output terminal OUT2 based on the voltage of the second node PD and the first voltage V1.

In the embodiment as shown in FIG. 9, the noise control circuit may include a thirteenth transistor M13, a fourteenth transistor M14, a fifteenth transistor M15, and a sixteenth transistor M16. A control electrode and a first electrode of the thirteenth transistor M13 are coupled to the second voltage terminal V2. A second electrode of the thirteenth transistor M13 is coupled to a second electrode of the fourteenth transistor M14 and a control electrode of the fifteenth transistor M15. A control electrode of the fourteenth transistor M14 is coupled to the first node PU. A first electrode of the fourteenth transistor M14 is coupled to the first voltage terminal V1. A first electrode of the fifteenth transistor M15 is coupled to the second voltage terminal V2. A second electrode of the fifteenth transistor M15 is coupled to the second node PD. A control electrode of the sixteenth transistor M16 is coupled to the first node PU. A first electrode of the sixteenth transistor M16 is coupled to the first voltage terminal V1. A second electrode of the sixteenth transistor M16 is coupled to the second node PD.

The first denoising circuit may include a seventeenth transistor M17. A control electrode of the seventeenth transistor M17 is coupled to the second node PD. A first electrode of the seventeenth transistor M17 is coupled to the first voltage terminal V1. A second electrode of the seventeenth transistor M17 is coupled to the first output terminal OUT1.

The second denoising circuit may include an eighteenth transistor M18. A control electrode of the eighteenth transistor M18 is coupled to the second node PD. A first electrode of the eighteenth transistor M18 is coupled to the first voltage terminal V1. A second electrode of the eighteenth transistor M18 is coupled to the second output terminal OUT2.

In the embodiment as shown in FIG. 9, the shift register 900 may further include a third denoising circuit. The third denoising circuit is configured to remove noise on the first node PU based on the voltage of the second node PD and the first voltage V1. As shown in FIG. 9, the third denoising circuit may include a nineteenth transistor M19. A control electrode of the nineteenth transistor M19 is coupled to the second node PD. A first electrode of the nineteenth transistor M19 is coupled to the first voltage terminal V1. A second electrode of the nineteenth transistor M19 is coupled to the first node PU.

Figure 10:
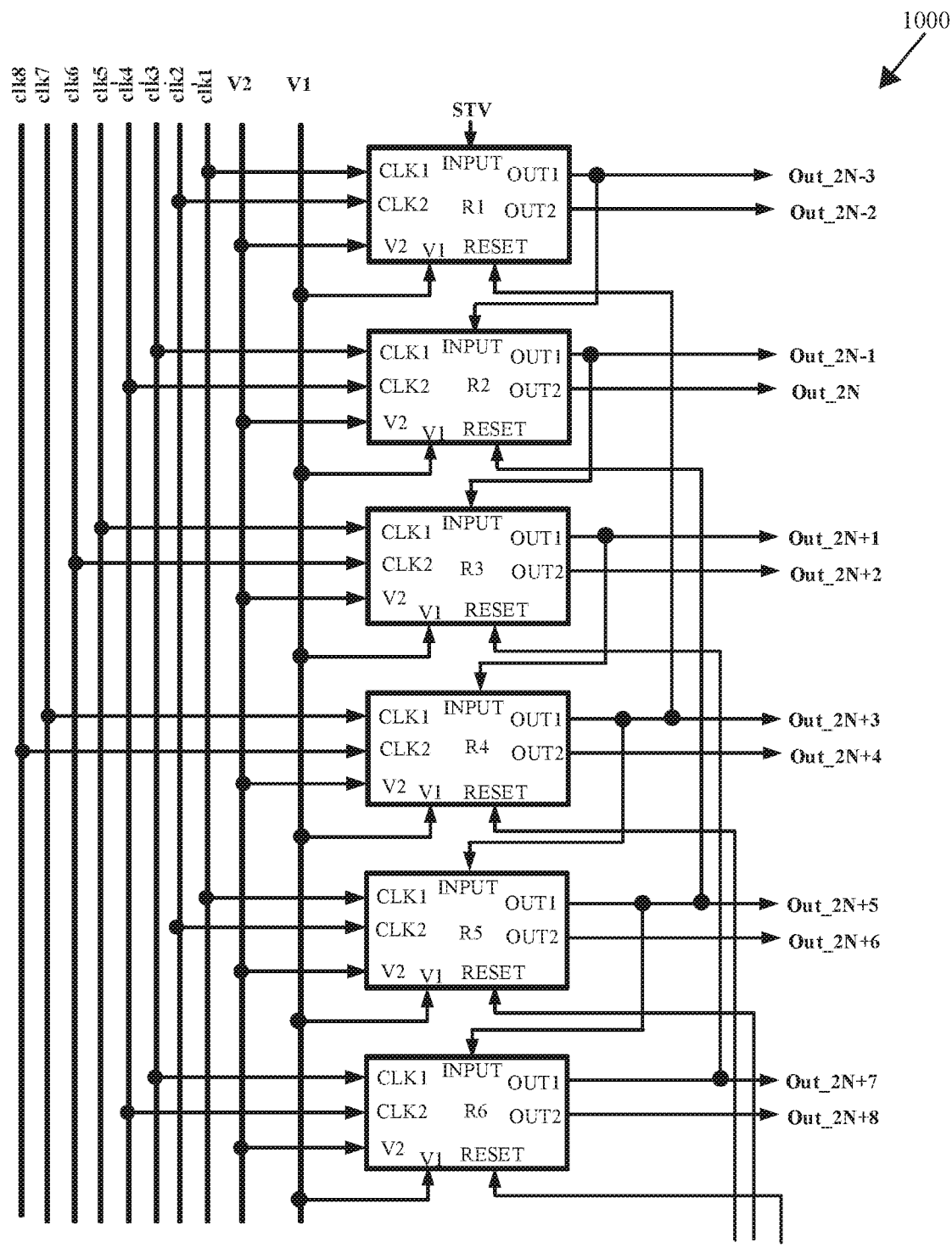
FIG. 10 is a schematic block diagram of a gate drive circuit according to an embodiment of the present disclosure.

FIG. 10 illustrates a schematic block diagram of a gate drive circuit 1000 according to an embodiment of the present disclosure. The gate drive circuit 1000 may include a plurality of cascaded shift registers (400 and 500) as described above. An input terminal INPUT of an $n^{th}$-stage shift register is coupled to a first output terminal OUT1 of a $(n-1)^{th}$-stage shift register. A reset signal terminal RESET of the $n^{th}$-stage shift register is coupled to the first output terminal OUT1 of a $(n+3)^{th}$-stage shift register. The input terminal INPUT of the first-stage shift register R1 is provided with a start signal STV. Here, n is a natural number greater than two.

In some embodiments of the present disclosure, the clock signal provided to the second clock signal terminal CLK2 of the $n^{th}$-stage shift register lags behind the clock signal provided to the first clock signal terminal CLK1 of the $n^{th}$-stage shift register by 1/q clock cycle. The clock signal provided to the first clock signal terminal CLK1 of the $(n+1)^{th}$-stage shift register lags behind the clock signal provided to the first clock signal terminal CLK1 of the $n^{th}$-stage shift register by 2/q clock cycle. q is a number greater than 1. In the example as shown in FIG. 10, the clock signal provided to the second clock signal terminal CLK2 of the $n^{th}$-stage shift register lags behind the clock signal provided to the first clock signal terminal CLK1 of the $n^{th}$-stage shift register by 1/8 clock cycle. The clock signal provided to the first clock signal terminal CLK1 of the $(n+1)^{th}$-stage shift register lags behind the clock signal provided to the first clock signal terminal CLK1 of the $n^{th}$-stage shift register by 1/4 clock cycle.

In FIG. 10, taking N=2 as an example. As shown in FIG. 10, the input terminal INPUT of the first-stage shift register R1 is provided with a start signal STV. The reset signal terminal RESET of the first-stage shift register R1 is coupled to the first output terminal OUT1 of the fourth-stage shift register R4. The first clock signal terminal CLK1 of the first-stage shift register R1 is provided with the first clock signal clk1. The second clock signal terminal CLK2 of the first-stage shift register R1 is provided with the second clock signal clk2. A scan signal OUT_2N−3 is outputted from the first output terminal OUT1 of the first-stage shift register R1, for the pixel circuits at the first row. A scan signal OUT_2N−2 is outputted from the second output terminal OUT2 of the first-stage shift register R1, for the pixel circuits at the second row.

The input terminal INPUT of the second-stage shift register R2 is coupled to the first output terminal OUT1 of the first-stage shift register R1. The reset signal terminal RESET of the second-stage shift register R2 is coupled to the first output terminal OUT1 of the fifth-stage shift register R5. The first clock signal terminal CLK1 of the second-stage shift register R2 is provided with a third clock signal clk3. The second clock signal terminal CLK2 of the second-stage shift register R2 is provided with a fourth clock signal clk4. A scan signal OUT_2N−1 is outputted from the first output terminal OUT1 of the second-stage shift register R2, for the pixel circuits at the third row. A scan signal OUT_2N is outputted from the second output terminal OUT2 of the second-stage shift register R2, for the pixel circuits at the fourth row.

The input terminal INPUT of the third-stage shift register R3 is coupled to the first output terminal OUT1 of the second-stage shift register R2. The reset signal terminal RESET of the third-stage shift register R3 is coupled to the first output terminal OUT1 of the sixth-stage shift register R6. The first clock signal terminal CLK1 of the third-stage shift register R3 is provided with a fifth clock signal clk5. The second clock signal terminal CLK2 of the third-stage shift register R3 is provided with a sixth clock signal clk6. A scan signal OUT_2N+1 is outputted from the first output terminal OUT1 of the third-stage shift register R3, for the pixel circuits at the fifth row. A scan signal OUT_2N+2 is outputted from the second output terminal OUT2 of the third-stage shift register R3, for the pixel circuits at the sixth row.

The input terminal INPUT of the fourth-stage shift register R4 is coupled to the first output terminal OUT1 of the third-stage shift register R3. The reset signal terminal RESET of the fourth-stage shift register R4 is coupled to the first output terminal OUT1 of a seventh-stage shift register (not shown). The first clock signal terminal CLK1 of the fourth-stage shift register R4 is provided with a seventh clock signal clk7. The second clock signal terminal CLK2 of the fourth-stage shift register R4 is provided with an eighth clock signal clk8. A scan signal OUT_2N+3 is outputted from the first output terminal OUT1 of the fourth-stage shift register R4, for the pixel circuits at the seventh row. A scan signal OUT_2N+4 is outputted from the second output terminal OUT2 of the fourth-stage shift register R4, for the pixel circuits at the eighth row.

The input terminal INPUT of the fifth-stage shift register R5 is coupled to the first output terminal OUT1 of the fourth-stage shift register R4. The reset signal terminal RESET of the fifth-stage shift register R5 is coupled to a first output terminal OUT1 of an eighth-stage shift register (not shown). The first clock signal terminal CLK1 of the fifth-stage shift register R5 is provided with the first clock signal clk1. The second clock signal terminal CLK2 of the fifth-stage shift register R5 is provided with the second clock signal clk2. A scan signal OUT_2N+5 is outputted from the first output terminal OUT1 of the fifth-stage shift register R5, for the pixel circuits at the ninth row. A scan signal OUT_2N+6 is outputted from the second output terminal OUT2 of the fifth-stage shift register R5, for the pixel circuits at the tenth row.

An input terminal INPUT of the sixth-stage shift register R6 is coupled to the first output terminal OUT1 of the fifth-stage shift register R5. The reset signal terminal RESET of the sixth-stage shift register R6 is coupled to a first output terminal OUT1 of a ninth-stage shift register (not shown). The first clock signal terminal CLK1 of the sixth-stage shift register R6 is provided with the third clock signal clk3. The second clock signal terminal CLK2 of the sixth-stage shift register R6 is provided with the fourth clock signal clk4. A scan signal OUT_2N+7 is outputted from the first output terminal OUT1 of the sixth-stage shift register R6, for the pixel circuits at the eleventh row. A scan signal OUT_2N+8 is outputted from the second output terminal OUT2 of the sixth-stage shift register R6, for the pixel circuits at the twelfth row. And so on.

In this embodiment, the first clock signal clk1 to the eighth clock signal clk8 sequentially lag by 1/8 clock cycle.

Figure 11:
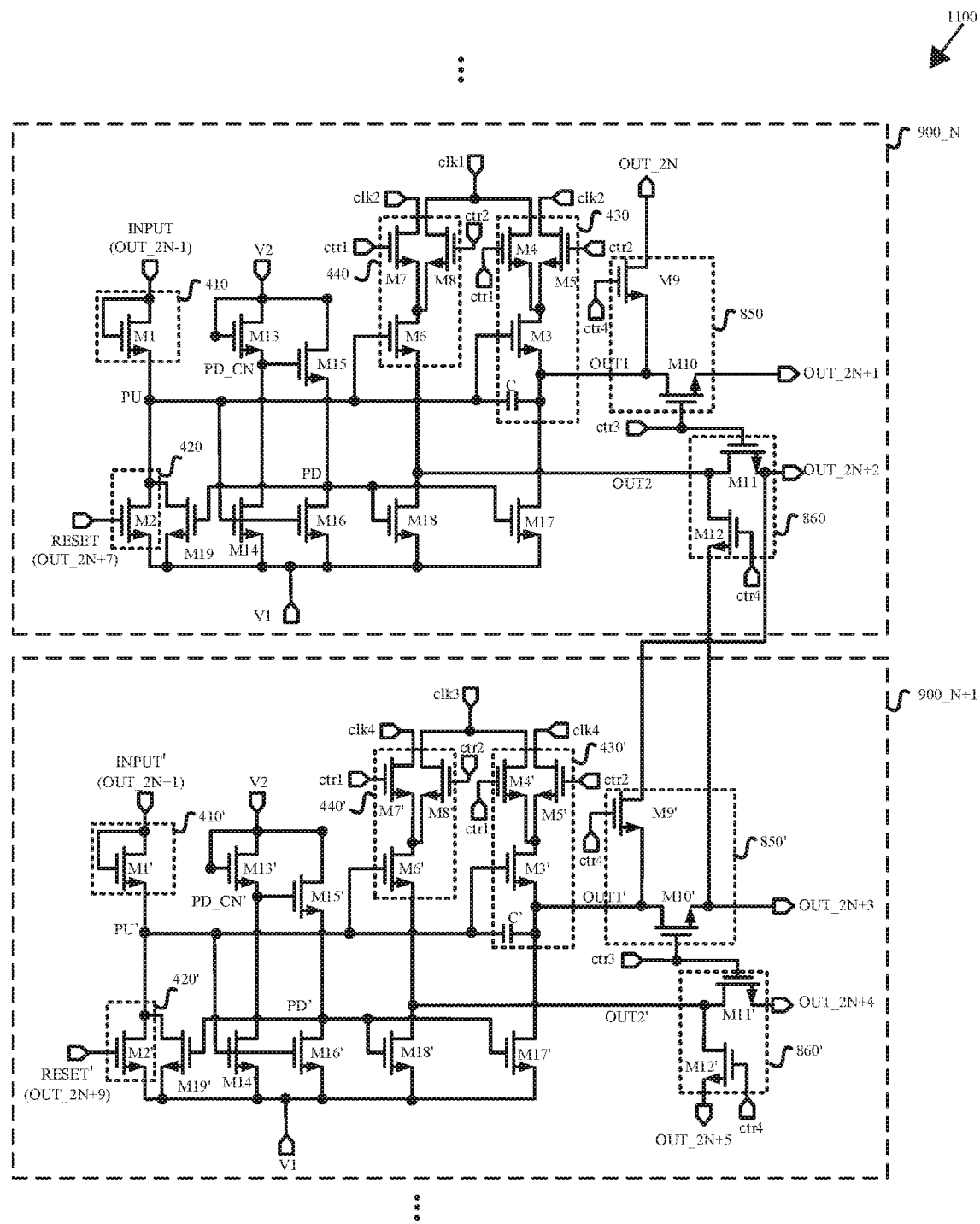
FIG. 11 is an exemplary circuit diagram of the gate drive circuit according to an embodiment of the present disclosure.

FIG. 11 illustrates an exemplary circuit diagram of a gate drive circuit 1100 according to an embodiment of the present disclosure. The gate drive circuit 1100 may include a plurality of cascaded shift registers (800 and 900) as described above. Only the $N^{th}$-stage shift register 900_N and the $(N+1)^{th}$-stage shift register 900_N+1 in the gate drive circuit 1100 are shown in FIG. 11. The $N^{th}$-stage shift register 900_N and the $(N+1)^{th}$-stage shift register 900_N+1 have the same structure as that of the shift register 900 as shown in FIG. 9.

As shown in FIG. 11, the input terminal INPUT of the $N^{th}$-stage shift register 900_N is provided with the scan signal at the $(2N−1)^{th}$ row. The reset signal terminal RESET of the $N^{th}$-stage shift register 900_N is provided with the scan signal at the $(2N+7)^{th}$ row. The first clock signal terminal of the $N^{th}$-stage shift register 900_N is provided with the first clock signal clk1. The second clock signal terminal of the $N^{th}$-stage shift register 900_N is provided with the second clock signal clk2. The first selection output terminal OUT_2N of the $N^{th}$-stage shift register 900_N is coupled to the third selection output terminal of the $(N−1)^{th}$-stage shift register (not shown). The second selection output terminal OUT_2N+1 of the $N^{th}$-stage shift register 900_N is coupled to the fourth selection output terminal of the $(N−1)^{th}$-stage shift register (not shown). The third selection output terminal OUT_2N+2 of the $N^{th}$-stage shift register 900_N is coupled to the first selection output terminal OUT_2N+2 of the $(N+1)^{th}$-stage shift register 900_N+1. The fourth selection output terminal OUT_2N+3 of the $N^{th}$-stage shift register 900_N is coupled to the second selection output terminal OUT_2N+3 of the $(N+1)^{th}$-stage shift register 900_N+1.

The input terminal INPUT' of the $(N+1)^{th}$-stage shift register 900_N+1 is coupled to the second selection output terminal OUT_2N+1 of the $N^{th}$-stage shift register 900_N, which is provided with the scan signal from the $(2N+1)^{th}$ row. The reset signal terminal RESET' of the $(N+1)^{th}$-stage shift register 900_N+1 is provided with the scan signal from a $(2N+9)^{th}$ row. The first clock signal terminal of the $(N+1)^{th}$-stage shift register 900_N+1 is provided with the third clock signal clk3. The second clock signal terminal of the $(N+1)^{th}$-stage shift register 900_N+1 is provided with the fourth clock signal clk4. The third selection output terminal OUT_2N+4 of the $(N+1)^{th}$-stage shift register 900_N+1 is coupled to a first selection output terminal of a (N+2)$^{th}$-stage shift register (not shown). The fourth selection output terminal OUT_2N+5 of the (N+1)$^{th}$-stage shift register 900_N+1 is coupled to a second selection output terminal of the (N+2)$^{th}$-stage shift register (not shown).

Figure 12:
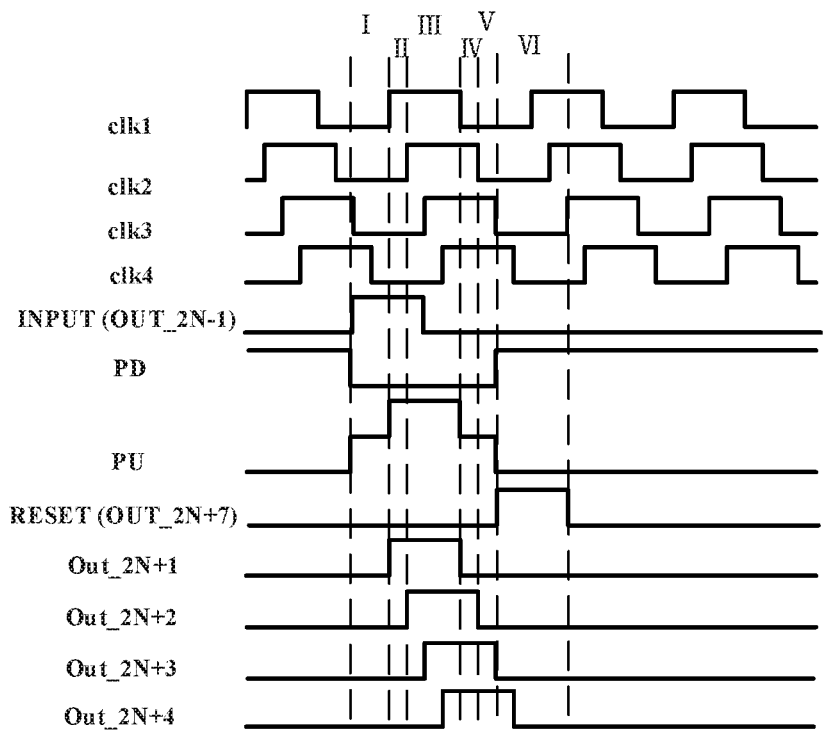
FIG. 12 is a timing diagram of some signals for the gate drive circuit as shown in FIG. 11.

FIG. 12 exemplarily shows an example of a timing diagram of some signals for the gate drive circuit 1100 as shown in FIG. 11. The second clock signal clk2 lags behind the first clock signal clk1 by 1/q clock cycle. The third clock signal clk3 lags behind the second clock signal clk2 by 1/q clock cycle. The fourth clock signal clk4 lags behind the third clock signal clk3 by 1/q clock cycle. q is a number greater than 1. In the example as shown in FIG. 12, the second clock signal clk2 lags behind the first clock signal clk1 by 1/8 clock cycle. The third clock signal clk3 lags behind the second clock signal clk2 by 1/8 clock cycle. The fourth clock signal clk4 lags behind the third clock signal clk3 by 1/8 clock cycle. In this example, it is assumed that the first control signal ctr1 and the third control signal ctr3 are at the high voltage level, and the second control signal ctr2 and the fourth control signal ctr4 are at the low voltage level.

Since the first control signal ctr1 is at the high voltage level, the fourth transistor M4 and the seventh transistor M7 of the N$^{th}$-stage shift register 900_N are enabled, and the fourth transistor M4' and the seventh transistor M7' of the (N+1)$^{th}$-stage shift register 900_N+1 are enabled. Because the second control signal ctr2 is at the low voltage level, the fifth transistor M5 and the eighth transistor M8 of the N$^{th}$-stage shift register 900_N are disabled, and the fifth transistor M5' and the eighth transistor M8' of the (N+1)$^{th}$-stage shift register 900_N+1 are disabled. Therefore, the first electrode of the third transistor M3 of the N$^{th}$-stage shift register 900_N is provided with the first clock signal clk1, the first electrode of the sixth transistor M6 of the N$^{th}$-stage shift register 900_N is provided with the second clock signal clk2, the first electrode of the third transistor M3' of the (N+1)$^{th}$-stage shift register 900_N+1 is provided with the third clock signal clk3, and the first electrode of the sixth transistor M6' of the (N+1)$^{th}$-stage shift register 900_N+1 is provided with the fourth clock signal clk4.

In the case where the third control signal ctr3 is at the high voltage level, the tenth transistor M10 and the eleventh transistor M11 of the N$^{th}$-stage shift register 900_N are enabled, and the tenth transistor M10' and the eleventh transistor M11' of the (N+1)$^{th}$-stage shift register 900_N+1 are enabled. When the fourth control signal ctr4 is at the low voltage level, the ninth transistor M9 and the twelfth transistor M12 of the N$^{th}$-stage shift register 900_N are disabled, and the ninth transistor M9' and the twelfth transistor M12' of the (N+1)$^{th}$-stage of the shift register 900_N+1 are disabled.

For the N$^{th}$-stage shift register 900_N, in the phase I, the input terminal INPUT is provided with the high voltage level. Therefore, the first transistor M1 is enabled, such that the voltage of the first node PU is at the high voltage level. Since the first node PU is at the high voltage level, the third transistor M3 and the sixth transistor M6 are enabled. At this stage, the first clock signal clk1 and the second clock signal clk2 are both at the low voltage level, and therefore, the low voltage levels are outputted from both the second selection output terminal OUT_2N+1 and the third selection output terminal OUT_2N+2.

In the phase II, the input terminal INPUT is provided with the high voltage level continuously. Therefore, the first transistor M1 continues to be enabled, such that the voltage of the first node PU continues to be at the high voltage level. Since the first node PU is at the high voltage level, the third transistor M3 and the sixth transistor M6 continue to be enabled. At this phase, the first clock signal clk1 is at the high voltage level, and the second clock signal clk2 is at the low voltage level. Therefore, the high voltage level is outputted from the second selection output terminal OUT_2N+1, and the low voltage level is outputted from the third selection output terminal OUT_2N+2. Since the voltage level of the second terminal of the capacitor C changes from the low voltage level to the high voltage level, the voltage level of the first terminal of the capacitor C is pulled up again.

In the phase III, the voltage of the first node PU continues to be at the high voltage level under the maintaining function of the capacitor C, so the third transistor M3 and the sixth transistor M6 continue to be enabled. At this phase, the first clock signal clk1 and the second clock signal clk2 are both at the high voltage level. Therefore, the high voltage levels are outputted from both the second selection output terminal OUT_2N+1 and the third selection output terminal OUT_2N+2.

In the phase IV, the voltage of the first node PU continues to be at the high voltage level under the maintaining function of the capacitor C, so the third transistor M3 and the sixth transistor M6 continue to be enabled. At this phase, the first clock signal clk1 becomes at the low voltage level, and the second clock signal clk2 is still at the high voltage level. Therefore, the low voltage level is outputted from the second selection output terminal OUT_2N+1, and the high voltage level is outputted from the third selection output terminal OUT_2N+2. Since the voltage level of the second terminal of the capacitor C changes from the high voltage level to the low voltage level, the voltage level of the first terminal of the capacitor C is pulled down as the voltage at the phase I.

In the phase V, the voltage level of the first node PU continues to be at the high voltage level under the maintaining function of the capacitor C, so the third transistor M3 and the sixth transistor M6 continue to be enabled. At this phase, the first clock signal clk1 continues to be at the low voltage level, and the second clock signal clk2 becomes at the low voltage level. Therefore, the low voltage levels are outputted from both the second selection output terminal OUT_2N+1 and the third selection output terminal OUT_2N+2.

In the phase VI, the reset signal terminal RESET is provided with a reset signal RESET, so the second transistor M2 is enabled. The low voltage level from the first voltage terminal V1 is provided to the first node PU. Since the first node PU is at the low voltage level, the third transistor M3 and the sixth transistor M6 are disabled. The low voltage levels are outputted from both the second selection output terminal OUT_2N+1 and the third selection output terminal OUT_2N+2 as in the previous phase.

It can be seen from FIG. 12 that the waveform outputted from the second selection output terminal OUT_2N+1 of the N$^{th}$-stage shift register 900_N follows the waveform of the first clock signal clk1 during the phase I to the phase V. The waveform outputted from the third selection output terminal OUT_2N+2 of the N$^{th}$-stage shift register 900_N follows the waveform of the second clock signal clk2 during the phase I to the phase V.

Similarly, the waveforms outputted from the second selection output terminal OUT_2N+3 and the third selection output terminal OUT_2N+4 of the (N+1)$^{th}$-stage shift register 900_N+1 can be obtained.

As shown in FIG. 12, scan signals are sequentially outputted from the second selection output terminal OUT_2N+1 and the third selection output terminal OUT_2N+2 of the $N^{th}$-stage shift register 900_N and the second selection output terminal OUT_2N+3 and the third selection output terminal OUT_2N+4 of the $(N+1)^{th}$-stage shift register 900_N+1.

In this example, the first selection circuit (850 and 850') provides the first scan signal to the second selection output terminal based on the third control signal ctr3 and the fourth control signal ctr4. The second selection circuit (860 and 860') provides the second scan signal to the third selection output terminal based on the third control signal ctr3 and the fourth control signal ctr4.

Figure 13:
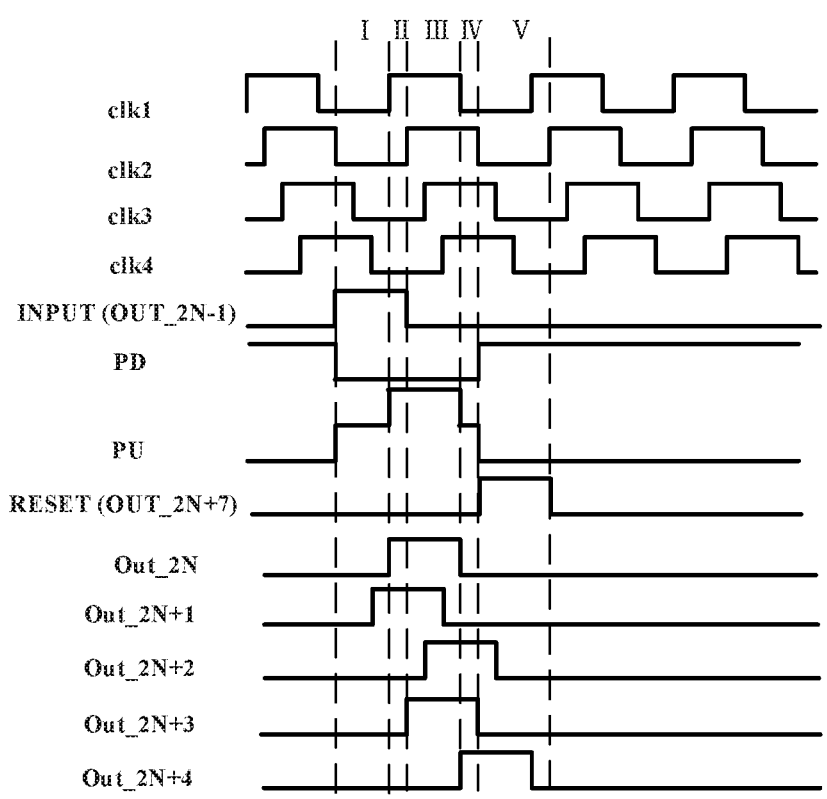
FIG. 13 is a timing diagram of some signals for the gate drive circuit as shown in FIG. 11.

FIG. 13 exemplarily shows another example of the timing diagram of some signals for the gate drive circuit 1100 shown in FIG. 11. Similar to FIG. 12, the second clock signal clk2 lags behind the first clock signal clk1 by 1/8 clock cycle. The third clock signal clk3 lags behind the second clock signal clk2 by 1/8 clock cycle. The fourth clock signal clk4 lags behind the third clock signal clk3 by 1/8 clock cycle. In this example, it is assumed that the first control signal ctr1 and the fourth control signal ctr4 are at the high voltage level, and the second control signal ctr2 and the third control signal ctr3 are at the low voltage level.

Since the first control signal ctr1 is at the high voltage level, the fourth transistor M4 and the seventh transistor M7 of the $N^{th}$-stage shift register 900_N are enabled, and the fourth transistor M4' and the seventh transistor M7' of the $(N+1)^{th}$-stage shift register 900_N+1 are enabled. Because the second control signal ctr2 is at the low voltage level, the fifth transistor M5 and the eighth transistor M8 of the $N^{th}$-stage shift register 900_N are disabled, and the fifth transistor M5' and the eighth transistor M8' of the $(N+1)^{th}$-stage shift register 900_N+1 are disabled. Therefore, the first electrode of the third transistor M3 of the $N^{th}$-stage shift register 900_N is provided with the first clock signal clk1, the first electrode of the sixth transistor M6 of the $N^{th}$-stage shift register 900_N is provided with the second clock signal clk2, the first electrode of the third transistor M3' of the $(N+1)^{th}$-stage shift register 900_N+1 is provided with the third clock signal clk3, and the first electrode of the sixth transistor M6' of the $(N+1)^{th}$-stage shift register 900_N+1 is provided with the fourth clock signal clk4.

In the case where the third control signal ctr3 is at the low voltage level, the tenth transistor M10 and the eleventh transistor M11 of the $N^{th}$-stage shift register 900_N are disabled, and the tenth transistor M10' and the eleventh transistor M11' of the $(N+1)^{th}$-stage shift register 900_N+1 are disabled. When the fourth control signal ctr4 is at the high voltage level, the ninth transistor M9 and the twelfth transistor M12 of the $N^{th}$-stage shift register 900_N are enabled, and the ninth transistor M9' and the twelfth transistor M12' of the $(N+1)^{th}$-stage of the shift register 900_N+1 are enabled.

For the $N^{th}$-stage shift register 900_N, in the phase I, the input terminal INPUT is provided with the high voltage level. Therefore, the first transistor M1 is enabled, such that the voltage of the first node PU is at the high voltage level. Since the first node PU is at the high voltage level, the third transistor M3 and the sixth transistor M6 are enabled. At this stage, the first clock signal clk1 and the second clock signal clk2 are both at the low voltage level, and therefore, the low voltage levels are outputted from both the first selection output terminal OUT_2N and the fourth selection output terminal OUT_2N+3.

In the phase II, the input terminal INPUT is provided with the high voltage level continuously. Therefore, the first transistor M1 continues to be enabled, such that the voltage of the first node PU continues to be at the high voltage level. Since the first node PU is at the high voltage level, the third transistor M3 and the sixth transistor M6 continue to be enabled. At this phase, the first clock signal clk1 is at the high voltage level, and the second clock signal clk2 is at the low voltage level. Therefore, the high voltage level is outputted from the first selection output terminal OUT_2N, and the low voltage level is outputted from the fourth selection output terminal OUT_2N+3. Since the voltage level of the second terminal of the capacitor C changes from the low voltage level to the high voltage level, the voltage level of the first terminal of the capacitor C is pulled up again.

In the phase III, the voltage of the first node PU continues to be at the high voltage level under the maintaining function of the capacitor C, so the third transistor M3 and the sixth transistor M6 continue to be enabled. At this phase, the first clock signal clk1 and the second clock signal clk2 are both at the high voltage level. Therefore, the high voltage levels are outputted from both the first selection output terminal OUT_2N and the fourth selection output terminal OUT_2N+3.

In the phase IV, the voltage of the first node PU continues to be at the high voltage level under the maintaining function of the capacitor C, so the third transistor M3 and the sixth transistor M6 continue to be enabled. At this phase, the first clock signal clk1 becomes at the low voltage level, and the second clock signal clk2 is still at the high voltage level. Therefore, the low voltage level is outputted from the first selection output terminal OUT_2N, and the high voltage level is outputted from the fourth selection output terminal OUT_2N+3. Since the voltage level of the second terminal of the capacitor C changes from the high voltage level to the low voltage level, the voltage level of the first terminal of the capacitor C is pulled down as the voltage at the phase I.

In the phase V, the reset signal terminal RESET is provided with a reset signal RESET, so the second transistor M2 is enabled. The low voltage level from the first voltage terminal V1 is provided to the first node PU. Since the first node PU is at the low voltage level, the third transistor M3 and the sixth transistor M6 are disabled. The low voltage level is outputted from the first selection output terminal OUT_2N+1 as in the previous phase. The fourth selection output terminal OUT_2N+3 is no longer provided with the high voltage level, so the low voltage level is outputted from the fourth selection output terminal OUT_2N+3.

It can be seen from FIG. 13 that the waveform outputted from the first selection output terminal OUT_2N of the $N^{th}$-stage shift register 900_N follows the waveform of the first clock signal clk1 during the phase I to the phase V. The waveform outputted from the fourth selection output terminal OUT_2N+3 of the $N^{th}$-stage shift register 900_N follows the waveform of the second clock signal clk2 during the phase I to the phase V.

Similarly, the waveforms outputted from the first selection output terminal OUT_2N+2 and the fourth selection output terminal OUT_2N+5 of the $(N+1)^{th}$-stage shift register 900_N+1 and a fourth selection output terminal OUT_2N+1 of the $(N-1)^{th}$-stage shift register (not shown) can be obtained.

Therefore, in this example, the first selection circuit (850 and 850') may provide the first scan signal to the first selection output terminal based on the third control signal ctr3 and the fourth control signal ctr4. The second selection circuit (860 and 860') may provide the second scan signal to the fourth selection output terminal based on the third control signal ctr3 and the fourth control signal ctr4.

Compared with the example as shown in FIG. 12, in FIG. 13, the waveform of the scan signal at the $2N^{th}$ row and the waveform of the scan signal at the $(2N+1)^{th}$ row are exchanged, and the waveform of the scan signal at the $(2N+2)^{th}$ row and the waveforms of the scan signals at the $(2N+3)^{th}$ rows are exchanged.

According to the above embodiment, the shift register may exchange the waveform outputted from the first selection output terminal and the waveform outputted from the second selection output terminal, and exchange the waveform outputted from the third selection output terminal and the waveform outputted from the fourth selection output terminal, based on the third control signal and the fourth control signal. Therefore, the shift register can change the order to light on the sub-pixels in another way without changing the architecture of the array substrate, so as to meet the needs of different users.

Those skilled in the art should understand that the embodiments of the present disclosure may further include exchanging only the waveform outputted from the first selection output terminal and the waveform outputted from the second selection output terminal based on other control signal, or only exchanging the waveform outputted from the third selection output terminal and the waveform outputted from the fourth selection output terminal based on other control signal, or only exchanging the waveform outputted from the second selection output terminal and the waveform outputted from the third selection output terminal based on other control signal.

Embodiments of the present disclosure also provide a drive method for driving the shift register as described above. In this drive method, the input signal INPUT is provided to the first node PU. Based on the first control signal ctr1, the second control signal ctr2, and the voltage of the first node PU, one of the first clock signal clk1 and the second clock signal clk2 is outputted from the first output terminal OUT1 as the first scan signal OUT1. Based on the first control signal ctr1, the second control signal ctr2, and the voltage of the first node PU, the other of the first clock signal clk1 and the second clock signal clk2 is outputted from the second output terminal OUT2 as the second scan signal OUT2.

In some embodiments of the present disclosure, the drive method may further include providing the first scan signal OUT1 to the first selection output terminal OUT_a based on the third control signal ctr3 and the fourth control signal ctr4, and providing the second scan signal OUT2 to the fourth selection output terminal OUT_d based on the third control signal ctr3 and the fourth control signal ctr4.

In some other embodiments of the present disclosure, the drive method may further include providing the first scan signal OUT1 to the second selection output terminal OUT_b based on the third control signal ctr3 and the fourth control signal ctr4, and providing the second scan signal OUT2 to the third selection output terminal OUT_c based on the third control signal ctr3 and the fourth control signal ctr4.

Figure 14:
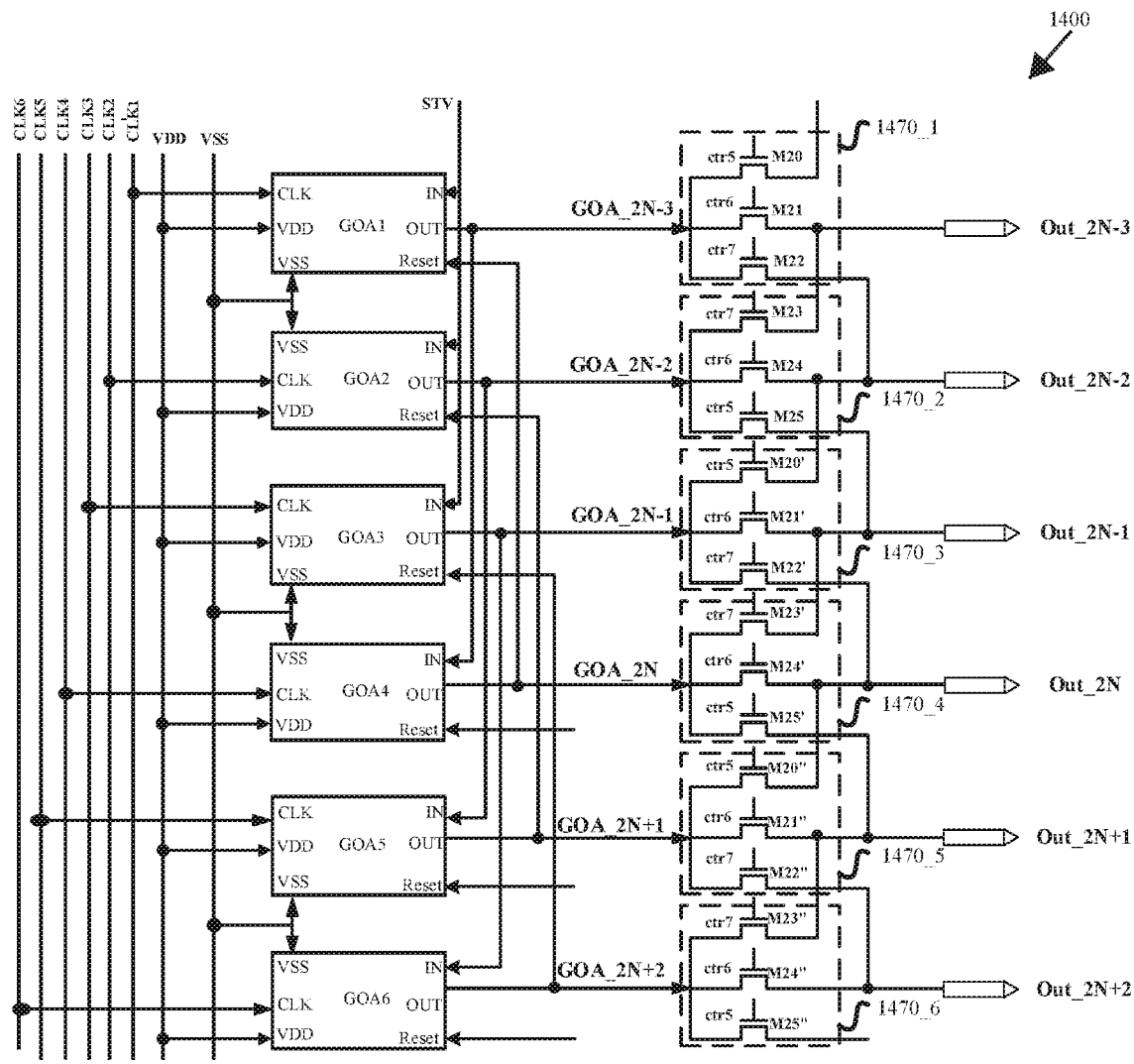
FIG. 14 is a schematic block diagram of the gate drive circuit according to an embodiment of the present disclosure.

FIG. 14 illustrates a schematic block diagram of a gate drive circuit 1400 according to another embodiment of the present disclosure. The gate drive circuit 1400 may include a plurality of cascaded shift registers (GOA1, GOA2, ..., hereinafter referred to as GOAn). The shift register GOAn may be one of a variety of known shift registers. The output terminal of the shift register GOAn at each stage is coupled to a respective selection circuit of a plurality of selection circuits (1470_1, 1470_2, ..., hereinafter referred to as 1470_n). The selection circuit 1470_n coupled to the $n^{th}$-stage shift register GOAn may be configured to provide a scan signal from the $n^{th}$-stage shift register GOAn to one of the pixel circuit (not shown) at the $(n-1)^{th}$ row, the pixel circuit (not shown) at the $n^{th}$ row and the pixel circuit (not shown) at the $(n+1)^{th}$ row. Here, n is a natural number greater than two. The selection circuit coupled to the first-stage shift register is configured to provide a scan signal from the first-stage shift register to the pixel circuit at the first row or the pixel circuit at the second row.

In some embodiments of the present disclosure, the selection circuit 1470_2M coupled to the $2M^{th}$-state shift register GOA(2M) may include a twentieth transistor M20, a twenty-first transistor M21, and a twenty-second transistor M22. A control electrode of the twentieth transistor M20 is coupled to the fifth control terminal ctr5. A first electrode of the twentieth transistor M20 is coupled to the output terminal GOA_2M of the $2M^{th}$-stage shift register GOA(2M). A second electrode of the twentieth transistor M20 is coupled to the pixel circuit at the $(2M-1)^{th}$ row. A control electrode of the twenty-first transistor M21 is coupled to a sixth control terminal ctr6. A first electrode of the twenty-first transistor M21 is coupled to the output terminal GOA_2M of the $2M^{th}$-stage shift register GOA(2M). A second electrode of the twenty-first transistor M21 is coupled to the pixel circuit at the $2M^{th}$ row. A control electrode of the twenty-second transistor M22 is coupled to a seventh control terminal ctr7. A first electrode of the twenty-second transistor M22 is coupled to the output terminal GOA_2M of the $2M^{th}$-stage shift register GOA(2M). A second electrode of the twenty-second transistor M22 is coupled to the pixel circuit at the $(2M+1)^{th}$ row. The selection circuit 1470_(2M+1) coupled to the $(2M+1)^{th}$-stage shift register may include a twenty-third transistor M23, a twenty-fourth transistor M24, and a twenty-fifth transistor M25. A control electrode of the twenty-third transistor M23 is coupled to the seventh control terminal ctr7. A first electrode of the twenty-third transistor M23 is coupled to the output terminal of the $(2M+1)^{th}$-stage shift register GOA(2M+1). A second electrode of the twenty-third transistor M23 is coupled to the pixel circuit at the $2M^{th}$ row. A control electrode of the twenty-fourth transistor M24 is coupled to the sixth control terminal ctr6. A first electrode of the twenty-fourth transistor M24 is coupled to the output terminal of the $(2M+1)^{th}$-stage shift register GOA(2M+1). A second electrode of the twenty-fourth transistor M24 is coupled to the pixel circuit at the $(2M+1)^{th}$ row. A control electrode of the twenty-fifth transistor M25 is coupled to a fifth control terminal ctr5. A first electrode of the twenty-fifth transistor M25 is coupled to the output terminal of the $(2M+1)^{th}$-stage shift register GOA(2M+1). A second electrode of the twenty-fifth transistor M25 is coupled to the pixel circuit at the $(2M+2)^{th}$ row. Here, M is a natural number.

Figure 15:
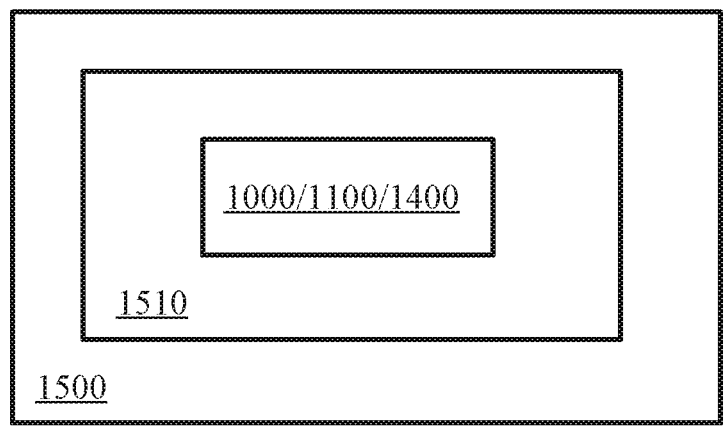
FIG. 15 is a schematic block diagram of a display device according to an embodiment of the present disclosure.

FIG. 15 illustrates a schematic block diagram of a display device 1500 according to an embodiment of the present disclosure. The display device 1500 includes an array substrate 1510. The array substrate 1510 includes the above-mentioned gate drive circuits (1000, 1100, and 1400).

The display device 1500 provided by embodiments of the present disclosure can be applied to any product with a display function, for example, among others, electronic paper, mobile phone, tablet computer, television, notebook computer, digital photo frame, wearable device, or navigator.

As used herein and in the appended claims, the singular form of a word includes the plural, and vice versa, unless the context clearly dictates otherwise. Thus, singular words are generally inclusive of the plurals of the respective terms. Similarly, the words "include" and "comprise" are to be interpreted as inclusively rather than exclusively. Likewise, the terms "include" and "or" should be construed to be inclusive, unless such an interpretation is clearly prohibited from the context. Where used herein the term "examples," particularly when followed by a listing of terms is merely exemplary and illustrative, and should not be deemed to be exclusive or comprehensive.

Further adaptive aspects and scopes become apparent from the description provided herein. It should be understood that various aspects of the present disclosure may be implemented separately or in combination with one or more other aspects. It should also be understood that the description and specific embodiments in the present disclosure are intended to describe rather than limit the scope of the present disclosure.

A plurality of embodiments of the present disclosure has been described in detail above. However, apparently those skilled in the art may make various modifications and variations on the embodiments of the present disclosure without departing from the spirit and scope of the present disclosure. The scope of protecting of the present disclosure is limited by the appended claims.

What is claimed is:

1. A shift register comprising an input circuit, a reset circuit, a first output circuit, and a second output circuit,
    wherein the input circuit is coupled to an input terminal and a first node, and is configured to provide an input signal from the input terminal to the first node;
    wherein the reset circuit is coupled to a reset signal terminal, the first node, and a first voltage terminal, and is configured to provide a first voltage from the first voltage terminal to the first node under the control of a reset signal from the reset signal terminal;
    wherein the first output circuit is coupled to the first node, a first control signal terminal, a second control signal terminal, a first clock signal terminal, a second clock signal terminal, and a first output terminal, and is configured to output from the first output terminal one of a first clock signal from the first clock signal terminal and a second clock signal from the second clock signal terminal, as a first scan signal, based on a first control signal from the first control signal terminal, a second control signal from the second control signal terminal, and a voltage of the first node;
    wherein the second output circuit is coupled to the first node, the first control signal terminal, the second control signal terminal, the first clock signal terminal, the second clock signal terminal, and a second output terminal, and is configured to output from the second output terminal the other of the first clock signal and the second clock signal, as a second scan signal, based on the first control signal, the second control signal, and the voltage of the first node,
    wherein the first output circuit comprises a third transistor, a fourth transistor, a fifth transistor, and a capacitor;
    wherein a control electrode of the third transistor is coupled to a first terminal of the capacitor and the first node, wherein a first electrode of the third transistor is coupled to a second electrode of the fourth transistor and a second electrode of the fifth transistor, and wherein a second electrode of the third transistor is coupled to a second terminal of the capacitor and the first output terminal;
    wherein a control electrode of the fourth transistor is coupled to the first control signal terminal, and wherein a first electrode of the fourth transistor is coupled to the first clock signal terminal;
    wherein a control electrode of the fifth transistor is coupled to the second control signal terminal, and wherein a first electrode of the fifth transistor is coupled to the second clock signal terminal;
    wherein the second output circuit comprises a sixth transistor, a seventh transistor, and an eighth transistor;
    wherein a control electrode of the sixth transistor is coupled to the first node, wherein a first electrode of the sixth transistor is coupled to a second electrode of the seventh transistor and a second electrode of the eighth transistor, and wherein a second electrode of the sixth transistor is coupled to the second output terminal;
    wherein a control electrode of the seventh transistor is coupled to the first control signal terminal, and wherein a first electrode of the seventh transistor is coupled to the second clock signal terminal;
    wherein a control electrode of the eighth transistor is coupled to the second control signal terminal, and wherein a first electrode of the eighth transistor is coupled to the first clock signal terminal;
    wherein when the first output circuit outputs the first clock signal as the first scan signal, the second output circuit outputs the second clock signal as the second scan signal; and
    wherein when the first output circuit outputs the second clock signal as the first scan signal, the second output circuit outputs the first clock signal as the second scan signal.

2. The shift register according to claim 1, wherein the input circuit comprises a first transistor,
    wherein a control electrode and a first electrode of the first transistor are coupled to the input terminal, and wherein a second electrode of the first transistor is coupled to the first node.

3. The shift register according to claim 1, wherein the reset circuit comprises a second transistor,
    wherein a control electrode of the second transistor is coupled to the reset signal terminal, wherein a first electrode of the second transistor is coupled to the first voltage terminal, and wherein a second electrode of the second transistor is coupled to the first node.

4. The shift register according to claim 1, further comprising a first selection circuit and a second selection circuit,
    wherein the first selection circuit is configured to provide the first scan signal to one of a first selection output terminal and a second selection output terminal based on a third control signal and a fourth control signal; and
    wherein the second selection circuit is configured to provide the second scan signal to one of a third selection output terminal and a fourth selection output terminal based on the third control signal and the fourth control signal.

5. The shift register according to claim 4, wherein the first selection circuit comprises a ninth transistor and a tenth transistor,
    wherein a control electrode of the ninth transistor is coupled to a fourth control signal terminal, wherein a first electrode of the ninth transistor is coupled to the first output terminal, and wherein a second electrode of the ninth transistor is coupled to the first selection output terminal;
    wherein a control electrode of the tenth transistor is coupled to a third control signal terminal, wherein a first electrode of the tenth transistor is coupled to the first output terminal, and wherein a second electrode of the tenth transistor is coupled to the second selection output terminal;

wherein the second selection circuit comprises an eleventh transistor and a twelfth transistor;
wherein a control electrode of the eleventh transistor is coupled to the third control signal terminal, wherein a first electrode of the eleventh transistor is coupled to the second output terminal, and wherein a second electrode of the eleventh transistor is coupled to the third selection output terminal; and
wherein a control electrode of the twelfth transistor is coupled to the fourth control signal terminal, wherein a first electrode of the twelfth transistor is coupled to the second output terminal, and wherein a second electrode of the twelfth transistor is coupled to the fourth selection output terminal.

6. The shift register according to claim 1, further comprising a noise control circuit, a first denoising circuit, and a second denoising circuit,
wherein the noise control circuit is configured to control a voltage of a second node based on the voltage of the first node, the first voltage, and a second voltage;
wherein the first denoising circuit is configured to remove noise on the first output terminal based on the voltage of the second node and the first voltage; and
wherein the second denoising circuit is configured to remove noise on the second output terminal based on the voltage of the second node and the first voltage.

7. The shift register according to claim 6, wherein the noise control circuit comprises a thirteenth transistor, a fourteenth transistor, a fifteenth transistor, and a sixteenth transistor,
wherein a control electrode and a first electrode of the thirteenth transistor are coupled to a second voltage terminal, and wherein a second electrode of the thirteenth transistor is coupled to a second electrode of the fourteenth transistor and a control electrode of the fifteenth transistor;
wherein a control electrode of the fourteenth transistor is coupled to the first node, and wherein a first electrode of the fourteenth transistor is coupled to the first voltage terminal;
wherein a first electrode of the fifteenth transistor is coupled to the second voltage terminal, and wherein a second electrode of the fifteenth transistor is coupled to the second node;
wherein a control electrode of the sixteenth transistor is coupled to the first node, wherein a first electrode of the sixteenth transistor is coupled to the first voltage terminal, and wherein a second electrode of the sixteenth transistor is coupled to the second node;
wherein the first denoising circuit comprises a seventeenth transistor;
wherein a control electrode of the seventeenth transistor is coupled to the second node, wherein a first electrode of the seventeenth transistor is coupled to the first voltage terminal, and wherein a second electrode of the seventeenth transistor is coupled to the first output terminal;
wherein the second denoising circuit comprises an eighteenth transistor; and
wherein a control electrode of the eighteenth transistor is coupled to the second node, wherein a first electrode of the eighteenth transistor is coupled to the first voltage terminal, and wherein a second electrode of the eighteenth transistor is coupled to the second output terminal.

8. The shift register according to claim 6, further comprising a third denoising circuit,
wherein the third denoising circuit is configured to remove noise on the first node based on the voltage of the second node and the first voltage;
wherein the third denoising circuit comprises a nineteenth transistor; and
wherein a control electrode of the nineteenth transistor is coupled to the second node, wherein a first electrode of the nineteenth transistor is coupled to the first voltage terminal, and wherein a second electrode of the nineteenth transistor is coupled to the first node.

9. A drive method for driving the shift register according to claim 1, the drive method comprising:
providing an input signal to the first node;
outputting from the first output terminal one of a first clock signal and a second clock signal, as a first scan signal, based on a first control signal, a second control signal, and a voltage of the first node; and
outputting from the second output terminal the other of the first clock signal and the second clock signal, as a second scan signal, based on the first control signal, the second control signal, and the voltage of the first node.

10. The drive method according to claim 9, further comprising:
providing the first scan signal to a first selection output terminal based on a third control signal and a fourth control signal, and providing the second scan signal to a fourth selection output terminal based on the third control signal and the fourth control signal; or
providing the first scan signal to a second selection output terminal based on the third control signal and the fourth control signal, and providing the second scan signal to a third selection output terminal based on the third control signal and the fourth control signal.

11. A gate drive circuit comprising a plurality of cascaded shift registers according to claim 1,
wherein an input terminal of an $n^{th}$-stage shift register is coupled to a first output terminal of a $(n-1)^{th}$-stage shift register, and wherein a reset signal terminal of the $n^{th}$-stage shift register is coupled to a first output terminal of a $(n+3)^{th}$-stage shift register;
wherein an input terminal of a first-stage shift register is provided with a start signal; and
wherein n is a natural number greater than 1.

12. The gate drive circuit according to claim 11, wherein the gate drive comprises at least eight clock signals forming four pair clock signals,
wherein each of the pair of clock signals comprising a first clock signal and a second clock signal are selectively connected to a first clock signal terminal and a second clock signal terminal of each of the plurality of shift registers,
wherein the second clock signal provided to the second clock signal terminal of the $n^{th}$-stage shift registers lags behind the first clock signal provided to the first clock terminal of the nth-stage shift register by 1/8 clock cycle, and wherein a first clock signal of next pair of the clock signals provided to a first clock signal terminal of a $(n+1)^{th}$-stage shift register lags behind the first clock signal provided to the first clock signal terminal of the nth-stage shift register by 1/4 clock cycle.

13. A shift register comprising first to eighth transistors and a capacitor,
wherein a control electrode and a first electrode of the first transistor are coupled to an input terminal at which an input signal is received, and wherein a second electrode of the first transistor is coupled to a first node;

wherein a control electrode of the second transistor is coupled to a reset signal terminal at which a reset signal is received, wherein a first electrode of the second transistor is coupled to a first voltage terminal at which a first voltage is received, and wherein a second electrode of the second transistor is coupled to the first node;

wherein a control electrode of the third transistor is coupled to a first terminal of the capacitor and the first node, wherein a first electrode of the third transistor is coupled to a second electrode of the fourth transistor and a second electrode of the fifth transistor, and wherein a second electrode of the third transistor is coupled to a second terminal of the capacitor and a first output terminal at which one of a first clock signal and a second clock signal is outputted as a first scan signal;

wherein a control electrode of the fourth transistor is coupled to a first control signal terminal at which a first control signal is received, and wherein a first electrode of the fourth transistor is coupled to a first clock signal terminal at which the first clock signal is received;

wherein a control electrode of the fifth transistor is coupled to a second control signal terminal at which a second control signal is received, and wherein a first electrode of the fifth transistor is coupled to a second clock signal terminal at which the second clock signal is received;

wherein a control electrode of the sixth transistor is coupled to the first node, wherein a first electrode of the sixth transistor is coupled to a second electrode of the seventh transistor and a second electrode of the eighth transistor, and wherein a second electrode of the sixth transistor is coupled to a second output terminal at which the other of the first clock signal and the second clock signal is outputted as a second scan signal;

wherein a control electrode of the seventh transistor is coupled to the first control signal terminal, and wherein a first electrode of the seventh transistor is coupled to the second clock signal terminal;

wherein a control electrode of the eighth transistor is coupled to the second control signal terminal, and wherein a first electrode of the eighth transistor is coupled to the first clock signal terminal;

wherein when the first clock signal is outputted at the first output terminal as the first scan signal, the second clock signal is outputted at the second output terminal as the second scan signal; and wherein when the second clock signal is outputted at the first output terminal as the first scan signal, the first clock signal is outputted at the second output terminal as the second scan signal.

14. The shift register according to claim 13, further comprising ninth to twelfth transistors, wherein a control electrode of the ninth transistor is coupled to a fourth control signal terminal, wherein a first electrode of the ninth transistor is coupled to a second electrode of the third transistor, and wherein a second electrode of the ninth transistor is coupled to a first selection output terminal;

wherein a control electrode of the tenth transistor is coupled to a third control signal terminal, wherein a first electrode of the tenth transistor is coupled to the second electrode of the third transistor, and wherein a second electrode of the tenth transistor is coupled to a second selection output terminal;

wherein a control electrode of the eleventh transistor is coupled to the third control signal terminal, wherein a first electrode of the eleventh transistor is coupled to the second electrode of the sixth transistor, and wherein a second electrode of the eleventh transistor is coupled to a third selection output terminal; and wherein a control electrode of the twelfth transistor is coupled to the fourth control signal terminal, wherein a first electrode of the twelfth transistor is coupled to the second electrode of the sixth transistor, and wherein a second electrode of the twelfth transistor is coupled to a fourth selection output terminal.

* * * * *